United States Patent [19]

Suzuki et al.

[11] 4,328,456
[45] May 4, 1982

[54] CAMERA WITH SOLAR BATTERIES CONNECTED IN SERIES OR PARALLEL

[75] Inventors: Ryoichi Suzuki, Kawasaki; Takashi Uchiyama, Yokohama, both of Japan

[73] Assignee: Canon Kabushiki Kaisha, Tokyo, Japan

[21] Appl. No.: 13,550

[22] Filed: Feb. 21, 1979

[30] Foreign Application Priority Data

Feb. 24, 1978 [JP] Japan .................................. 53/20656
Feb. 24, 1978 [JP] Japan .................................. 53/20657
Apr. 7, 1978 [JP] Japan .................................. 53/41027
Apr. 7, 1978 [JP] Japan .................................. 53/41028

[51] Int. Cl.$^3$ ........................ H02J 7/00; H02J 15/00
[52] U.S. Cl. ..................................... 320/7; 323/906;
354/51; 354/60 R
[58] Field of Search ............ 136/89 AC, 293; 307/71;
320/2, 7, 16–18, 43; 323/15, 906; 354/22, 23 R,
51, 60 R

[56] References Cited

U.S. PATENT DOCUMENTS

| 3,387,194 | 6/1968 | Banks ................................. 320/7 X |
| 3,636,539 | 1/1972 | Gaddy ............................ 136/89 AC |
| 4,100,427 | 7/1978 | Durand et al. ................. 136/89 AC |
| 4,126,874 | 11/1978 | Suzuki et al. .................... 354/60 R |
| 4,134,057 | 1/1979 | Portmann ........................ 323/15 X |
| 4,175,249 | 11/1979 | Gruber ................................. 323/15 |

FOREIGN PATENT DOCUMENTS 2359908 6/1974 Fed. Rep. of Germany ........ 136/89 AC
884793 12/1961 United Kingdom .......... 136/89 AC

OTHER PUBLICATIONS

Wright, "Design and Orbital Performance of the Intelsat III Power System", Proceeding of the 7th Intersociety Energy Conversion Engineering Conference, San Diego, Calif. 25–29, Sep. 1972, pp. 472–482.

Primary Examiner—A. D. Pellinen
Attorney, Agent, or Firm—Toren, McGeady & Stanger

[57] ABSTRACT

A charge circuit for secondary batteries. The charge circuit encompasses a control circuit having as a power source accumulators chargeable with the current resulting from the electromotive force of a plural number of solar batteries built in a camera. The plural number of the solar batteries are distributed at a plural number of portions on the exterior of the camera. The plural number of the solar batteries are connected in series or parallel or, in accordance with necessity, a serial-parallel connection change-over of the solar batteries is carried out. Circuits for comparing the level at both terminals of each solar battery and for short-circuiting the terminal in accordance with the result of the comparison are provided.

7 Claims, 24 Drawing Figures

F I G. 24
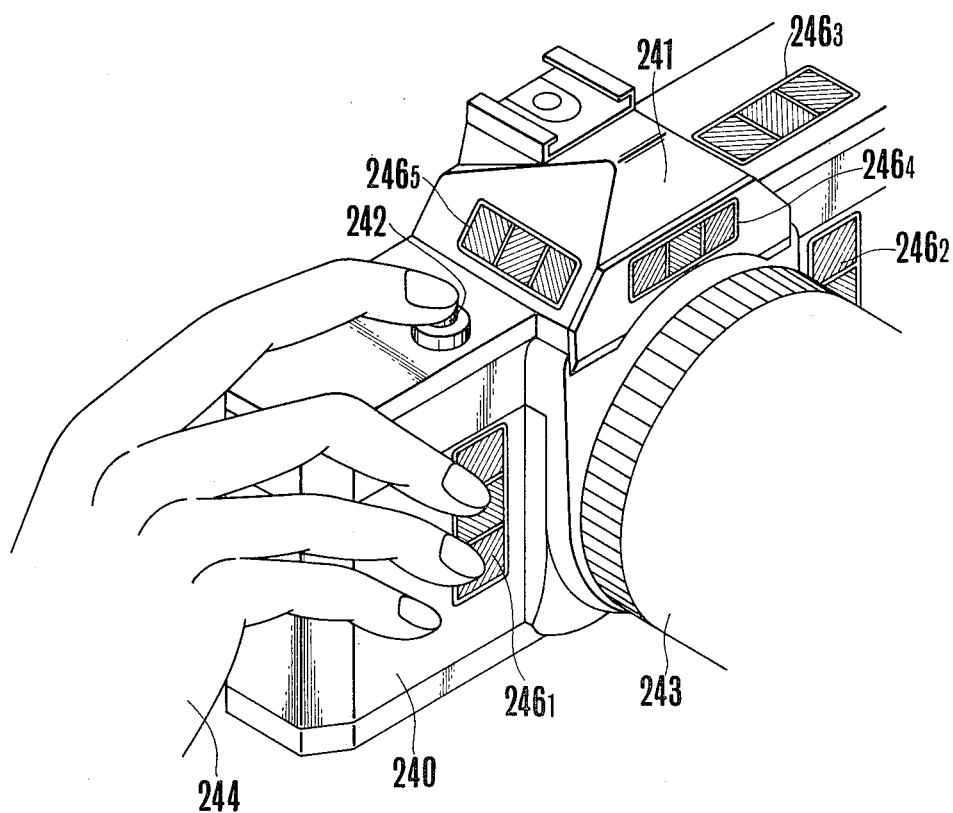

CAMERA WITH SOLAR BATTERIES CONNECTED IN SERIES OR PARALLEL

BACKGROUND OF THE INVENTION

1. Field of the Invention

The present invention relates to a power source device for a camera having accumulators chargeable as secondary batteries with the current resulting from the electromotive force of solar batteries.

2. Description of the Prior Art

Generally, minute primary batteries with small capacity such as silver batteries, mercury batteries and so on, are typically used as the power source for the light measuring circuit, the control circuit and so on, of a camera. However, the electromotive force of these batteries lowers due to battery discharge. Consequently, when the electromotive force lowers, the shutter operation and so on, of the camera become partially or totally impossible. Recently, the electronic techniques in the camera field have made remarkable progress, and there is a consequent tendency to increase the power consumption in various circuits of the camera. Accordingly, the electromotive force of the power source is often abruptly lowered so as to bring the camera into a non-operative state. This kind of difficulty can be overcome by changing the consumed battery for a new one, so that it is necessary for the photographer to carry the spare battery all the time during his photographing, which is inconvenient.

For this reason, it has been proposed that solar batteries and accumulators as secondary batteries, such as Ni-cd batteries and so on, be built in a camera so that the secondary batteries are always charged by means of the current due to the electromotive force of the solar batteries, so that this arrangement be used as the power source for the electrical circuit of the camera. In this way, the secondary batteries are always charged by means of the solar batteries so that a considerably long life can be obtained as compared with the power source system having primary batteries. However, the electromotive force of the solar battery unit is as low as 0.6 V even in the no-load condition. Accordingly, it is necessary to connect a plural number of the solar battery cells in series in order to obtain a sufficient voltage for charging the secondary battery as a power source for a camera with, for example, 1.3 to 6 V.

Thus, in the case of the conventional camera in which solar batteries are built, as is shown in FIG. 1, a plural number of the solar batteries $1_1, 1_2, 1_3-1_n$ connected in series charge the secondary battery 4 through the non-return diode 2 and the charge current limiting resistance 3. To this secondary battery 4, the control circuit 6 of the camera is connected through the power switch 5. By connecting a plural number of the solar batteries $1_1, 1_2, 1_3-1_n$ in series in this way, a sufficient photo-electromotive force can be obtained, so as to charge the secondary battery. However, when a plural number of the solar batteries $1_1, 1_2, 1_3-1_n$ are connected in series, even if the light incident upon only one of the batteries is shaded, no current from the electromotive force of the batteries can be obtained due to the property of solar batteries.

In order to solve this problem, it has been proposed that a plural number of solar batteries be connected as is shown in FIG. 2. For example, 16 solar batteries $1_a, 1_b, 1_c-1_p$ are divided into four groups, each consisting of four serial-connected batteries, while the groups are connected in parallel in such a manner that the composed output of the groups charge the secondary battery 4 through the non-return diode 2 and the charge current limiting resistance 3. To this secondary battery 4, the control circuit 6 of the camera is connected through the power source switch 5. In this way, a certain number of solar batteries are divided into several battery groups, each consisting of several serial-connected batteries, while the battery groups are connected in parallel in such a manner that even if the light incident upon one or two solar batteries were shaded, a sufficient photo-current for charging the secondary batteries can be obtained. In the case of the system in accordance with which a plural number of solar batteries are connected, a sufficient photo-current can be obtained under high brightness, while it cannot be obtained under low brightness.

Further, the plural number of solar batteries shown in FIGS. 1 and 2 are provided on the front plane of the camera body so that there is a possibility that the light incident upon several solar batteries may be shaded depending upon the holding condition of the camera at the time of photographing.

In FIG. 3, 10 is the camera body, 11 is the pentagonal prism cover and 12 is the photographing lens and 13a and 13b are the battery units, each being composed of eight solar batteries provided on both sides on the front plane of the camera body 10. 14a and 14b show the hands of the photographer during photographing. As is shown in the drawing, a part of the solar battery units 13a and 13b is shaded by means of the hands of the photographer. That is, the light incident upon some solar batteries is partially or totally shaded. Consequently, in a system in accordance to which a plural number of solar batteries are connected as is shown in FIG. 1, no photo-current can be obtained, while in a system as shown in FIG. 2, sufficient photo-current cannot be obtained.

SUMMARY OF THE INVENTION

A primary purpose of the present invention is to eliminate the above-mentioned shortcomings, by detecting the electromotive force of each of the solar batteries so as to short-circuit both terminals of solar batteries whose electromotive force is below a certain determined value.

A second purpose of the present invention is to detect the electromotive force of the connected solar batteries so as to connect solar batteries selectively in series or parallel in accordance with the electromotive force.

A third purpose of the present invention is to detect the electromotive force of solar batteries for selectively connecting a plural number of accumulators as secondary batteries in series or parallel in accordance with the electromotive force of solar batteries.

A fourth purpose of the present invention is to distribute a plural number of solar batteries at various portions of the camera in such a manner that the number of solar batteries on which the incident light is shaded is kept as small as possible.

In accordance with the invention, a power source device having solar batteries comprises a plural number of solar batteries connected in series, an accumulator to be charged with the photo-current produced with the plural number of solar batteries, and non-return means connected between the plural number of solar batteries and the accumulator so as to prevent back current flow from the accumulator. Also included are switching means connected between both terminals of each solar battery so that both terminals of the respective solar battery are not short-circuited when the switching means is opened, while both terminals are short-circuited when the switching means is closed. Finally included are comparator means for comparing the levels at both terminals of each of the solar batteries with each other. The comparator means open the switching means when the difference between the levels at both terminals of the solar battery is higher than at a certain determined value. The comparator means closes the switching when the difference is lower than the determined value.

For a better understanding of the present invention, reference is made to the following description and accompanying drawings, while the scope of the present invention will be pointed out in the appended claims.

BRIEF DESCRIPTION OF THE DRAWINGS

In the drawings:

FIG. 24 shows a camera for showing another embodiment of the arrangement of the solar battery in each of the embodiments of the electrical circuit in accordance with the present invention.

DESCRIPTION OF THE PREFERRED EMBODIMENTS

Below, the first embodiment will be explained in detail in accordance with FIG. 4.

Figure 4:
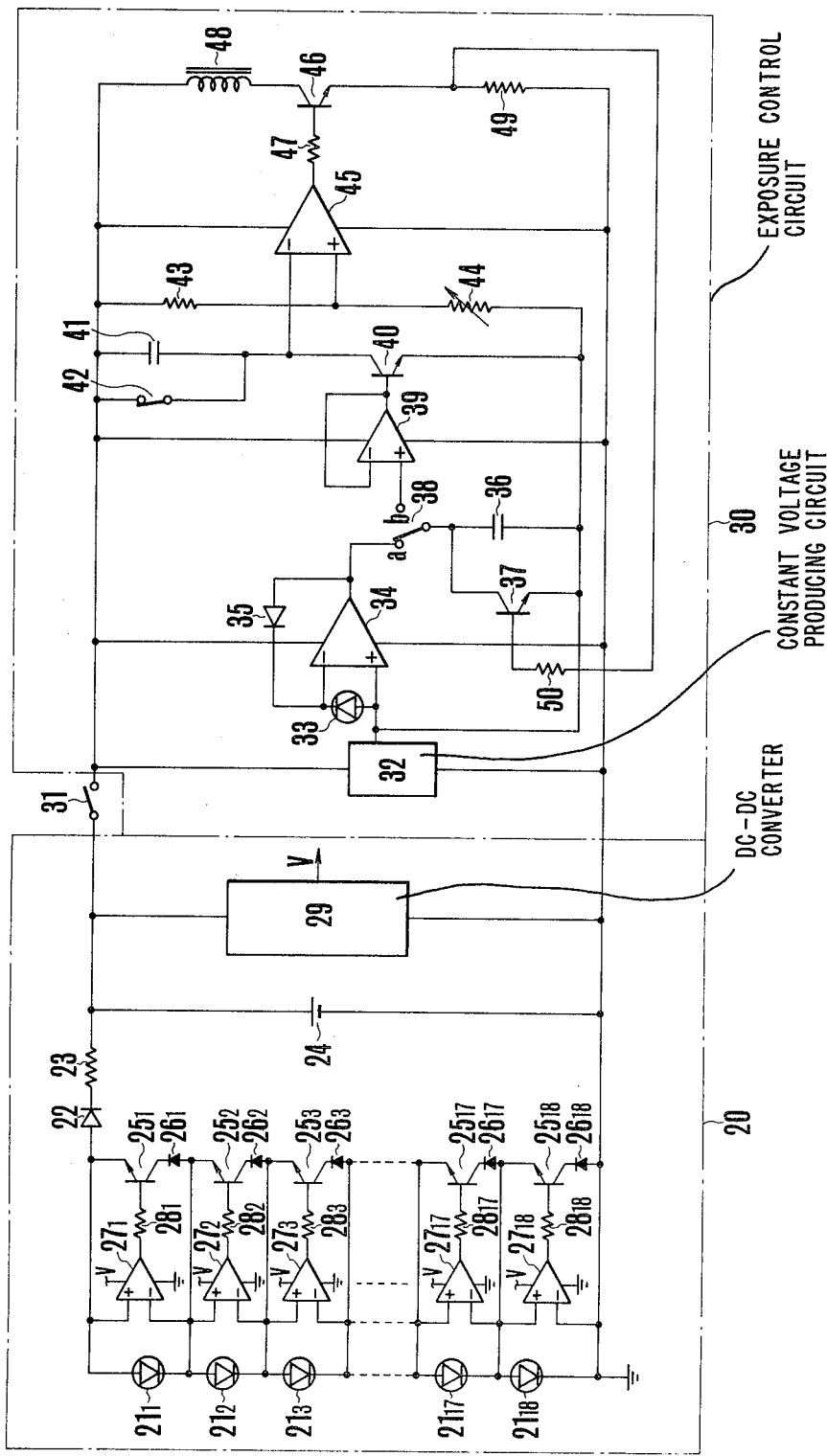
FIG. 4 shows a first embodiment of the electrical circuit in accordance with the present invention of the power source device of the camera in which the solar batteries are in series.

FIG. 4 shows an electrical circuit of the power source device in which the solar battery is built, where element 20 is a power source circuit, while element 30 is an exposure control circuit. In the power source circuit, $21_1$, $21_2$–$21_{18}$ are, for example, 18 solar batteries connected in series with each other, wherein these solar batteries $21_1$, $21_2$–$21_{18}$ are connected to a secondary battery, namely, an accumulator, through non-return diode 22 and charge current-limiting resistance 23. Elements $25_1$, $25_2$–$25_{18}$ are switching transistors, respectively connected to both terminals of the solar batteries $21_1$, $21_2$–$21_{18}$ through the diodes $26_1$, $26_2$–$26_{18}$. Elements $27_1$, $27_2$–$27_{18}$ are comparators having their first and second input terminals connected to both terminals of the solar batteries $21_1$, $21_2$–$21_{18}$. The output terminals of these comparators $27_1$, $27_2$–$27_{18}$ are connected to the bases of the transistors $25_1$, $25_2$–$25_{18}$ through resistances $28_1$, $28_2$–$28_{18}$. Element 29 is a DC-DC converter for stepping up and delivering the voltage of the secondary battery 24 to the comparators $27_1$, $27_2$–$27_{18}$.

Exposure control circuit 30 is composed of a light measuring circuit connected in parallel with secondary battery 24 through power source switch 31, a memory circuit and a time control circuit. Element 32 is a constant voltage producing circuit; element 33 is a light sensing element such as a silicon photocell (SPC); element 34 is an operational amplifier whose feedback circuit is provided with a logarithmic compression diode 35; element 36 is a memory condenser; element 37 is a transistor forming the discharge circuit of the memory condenser 36; element 38 is a memory switch; element 39 is a buffer operational amplifier; element 40 is an elongation transistor; element 41 is a timing condenser; element 42 is a count switch to be opened with the start of the leading shutter curtain; and elements 43 and 44 are voltage dividing resistances. Element 44 is, in particular, a variable resistance for setting photographing information such as film sensitivity. Element 45 is a comparator; element 46 is a switching transistor to which the output of the comparator 45 is supplied through the resistance 47; and element 48 is a tail shutter curtain holding magnet, the current supply to which is controlled by means of the transistor 46. Element 48 is a magnet having a permanent magnet. When the current is supplied to the magnet 48, the magnetic flux then produced is cancelled by that of the permanent magnet so as to release the holding of the tail shutter curtain.

Element 49 is a resistance connected to the transistor 46. Element 50 is a resistance connected to transistor 37 and the output of transistor 46 is applied to transistor 37.

The explanation is now made of a case where 18 solar batteries are connected in series. However, the number of solar batteries may be more or less than 18, that is, $1 \simeq n$ pieces of solar batteries may be connected, so that the same number of comparators, transistors and so on, as that of the solar batteries, has to be provided.

Below, the operation of the above-mentioned construction will be explained in detail. The two input terminals of the comparators $27_1$, $27_2$–$27_{18}$ have applied thereto the voltage level differences corresponding to the electromotive force of the solar batteries $21_1$, $21_2$–$21_{18}$. As long as the voltage level differences are larger than a certain determined value, the level of the outputs of the comparators $27_1$, $27_2$–$27_{18}$ is low and the transistors $25_1$, $25_2$–$25_{18}$ are in the switched-off state. On the other hand, when the voltage level difference at the two input terminals of the comparators $27_1$, $27_2$–$27_{18}$ is smaller than a certain determined value, the level of the outputs of the comparators $27_1$, $27_2$–$27_{18}$ is high so that the transistors $25_1$, $25_2$–$25_{18}$ are in the switched-on state. Consequently, if, for some reason, the light incident upon, for example, solar battery $21_2$ of the group $21_1$, $21_2$–$21_{18}$ were largely decreased and the electromotive force of $21_2$ were lowered, the difference between the voltages at both terminals of $21_2$ becomes nearly zero so that the level of the output of the comparator $27_2$ becomes high. Thus, the transistor $25_2$ is brought into the switched-on state so that solar battery $21_2$ is short-circuited by means of the emitter and the collector of the transistor $25_2$. Consequently, in this state, a current due to the electromotive force then produced from the solar batteries $21_1$, $21_3$–$21_{18}$ runs through the transistor $25_2$ in the switched-on state. With this current, the secondary battery 24 is charged.

Now, explanation is made in the case where the electromotive force of solar battery $21_2$ is lowered. However, the same thing can be said of the case with either of the other solar batteries $21_1$, $21_3$–$21_{18}$. Further, the same thing can be said in the case where the electromotive force of some of the solar batteries $21_1$, $21_2$–$21_{18}$ is lowered. That is, when the electromotive force of one or some of the solar batteries $21_1$, $21_2$–$21_{18}$ is lowered due to the light shading or the like, both terminals of the solar battery or batteries, whose electromotive force is lowered, are short-circuited. Accordingly, as long as the electromotive force of the remaining solar batteries is sufficient to charge the secondary battery 24, the battery 24 is charged with the electromotive force of the remaining solar batteries. The charge of the secondary battery 24 with the photoelectric current of the solar batteries $21_1$, $21_2$–$21_{18}$ is carried out through the non-return diode 22 and the charge current-limiting resistance 23.

Thus, the voltage at both terminals of the secondary battery 24 to be charged is applied to the exposure control circuit 30 through the power source switch 31. Consequently, when the power source switch 31 is closed, the light sensing element 33 produces an output corresponding to the brightness of the object to be photographed, while the operational amplifier 34 produces a brightness signal proportional to the logarithm of the brightness. This brightness signal voltage is memorized in the memory condenser 36. Along with the release operation of the camera, the mirror-up operation is started and switch 38 is changed over to the side of the contact b. Thus, a current corresponding to the logarithmically elongated value stored in the condenser 36 flows through the transistor 40.

When the leading shutter curtain starts to run after the mirror-up operation, the switch 42 opens in such a manner that the condenser 41 is charged by the current flowing between the emitter and the collector of the transistor 40. When the terminal voltage of the condenser 41 is lowered below the voltage dividing level of the resistances 43 and 44, the level of the output of the comparator 45 becomes high and the transistor 46 is brought into the switched-on state so as to excite the tail shutter curtain holding magnet 48 in such a manner that the tail shutter curtain starts to run for completing the exposure. When the transistor 46 is brought into the switched-on state, the transistor 37 is brought into the switched-on state and the charge on condenser 36 is discharged.

Below, the second embodiment in accordance with the present invention will be explained in detail in accordance with FIG. 5.

Figure 5:
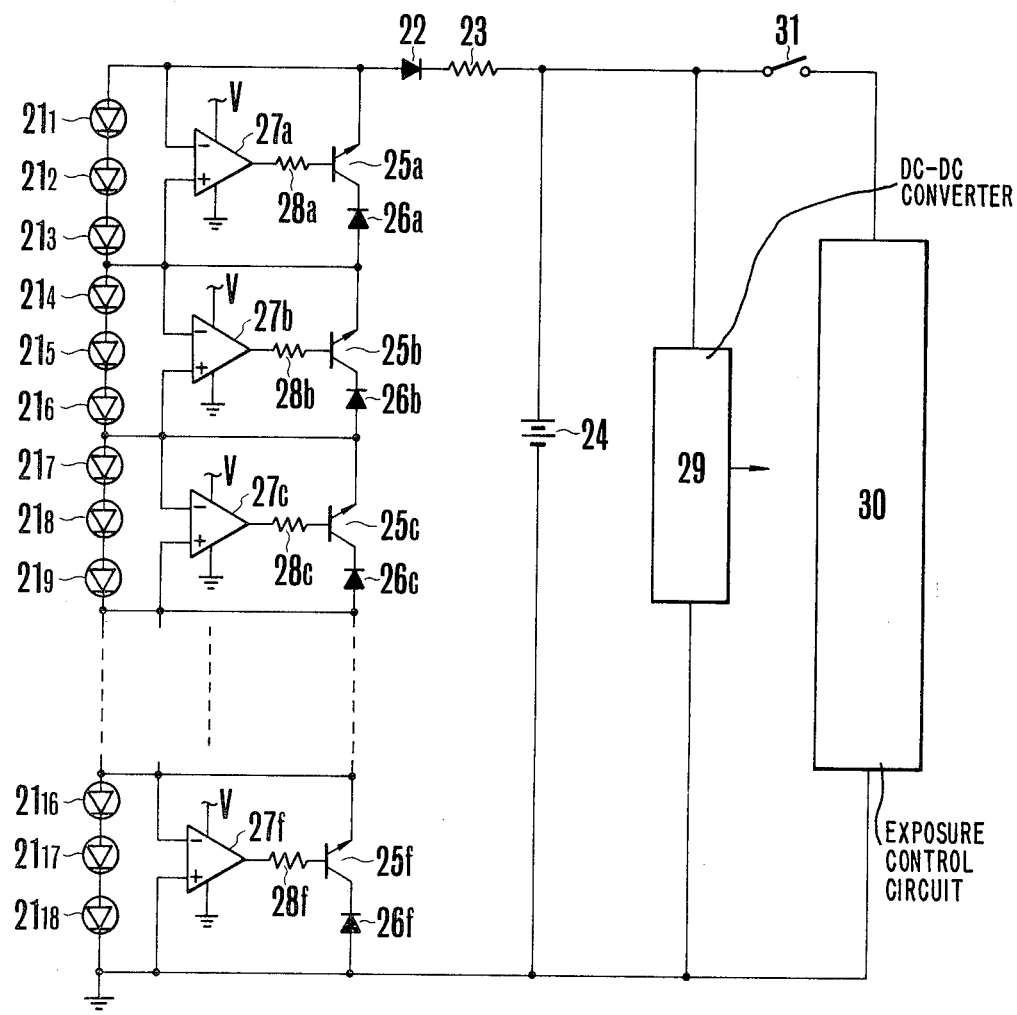
FIG. 5 shows a second embodiment of the electrical circuit in accordance with the present invention of the power source device of the camera in which the solar batteries are in groups of three series connected batteries.

In FIG. 5, a number, for example, 18 solar batteries $21_1$, $21_2$–$21_{18}$ connected in series, are divided into six groups, each group composed of three batteries, and circuits are provided so as to compare group to group and short-circuit them. The elements with the same figures as those in FIG. 4 are again used in FIG. 5, and their explanation is omitted here. In particular, elements 25a, 25b–25f are the switching transistors connected to the groups, each group consisting of three solar batteries $21_1$–$21_3$, $21_4$–$21_6$, $21_7$–$21_9$, $21_{10}$–$21_{12}$, $21_{13}$–$21_{15}$, $21_{16}$–$21_{18}$ through the diodes 26a, 26b, 26f, Elements 26b–26f, 27a, 27b–27f are the comparators –26f, having first and second input terminals connected to the groups, each group consisting of three solar batteries $21_1$–$21_3$, $21_4$–$21_6$, $21_7$–$21_9$, $21_{10}$–$21_{12}$, $21_{13}$–$21_{15}$, $21_{16}$–$21_{18}$. The output terminals of these comparators 27a, 27b–27f are connected to the bases of the transistors 25a, 25b–25f through the resistances 28a, 28b–28f.

Consequently, the two input terminals of the comparators 27a, 27b–27f have applied thereto the voltage level difference corresponding to the electromotive forces of the groups, each consisting of three solar batteries $21_1$–$21_3$, $21_4$–$21_6$, $21_7$–$21_9$, $21_{10}$–$21_{12}$, $21_{13}$–$21_{15}$, $21_{16}$–$21_{18}$. Thus, as long as the voltage level difference is larger than a certain determined value, the level of the output of each comparator 27a, 27b–27f is low, so that each transistor 25a, 25b, 25c–25f is in the switched-off state. On the other hand, when the voltage level difference is smaller than a certain determined value, the level of the output of each comparator 27a, 27b–27f is high and each transistor 25a, 25b–25f is in the switched-on state. For example, when, for some reason, the light incident upon the solar battery $21_5$ is largely weakened and the electromotive force of the solar battery $21_5$ is lowered, the voltage between the terminals of the group of solar batteries $21_4$–$21_6$ is lowered in such a manner that the level of the output of the comparator 27b becomes high. Thus, transistor 25b is brought into the switched-on state and the solar batteries $21_4$–$21_6$ are short-circuited by means of the emitter and the collector of the transistor 25b. Consequently, the current resulting from the electromotive forces of the remaining solar batteries $21_1$–$21_3$, $21_7$–$21_{18}$ flows through the transistors 25b in the switched-on state in such a manner that the secondary battery 24 is charged with this current. Thus, although the explanation has been made concerning the case where the electromotive force of the solar battery $21_5$ is lowered, the same thing can be said when the electromotive force of either of the other solar battery groups $21_1$–$21_4$, $21_6$–$21_{18}$ is lowered.

Below, the third embodiment of the present invention will be explained in detail in accordance with FIG. 6.

Figure 6:
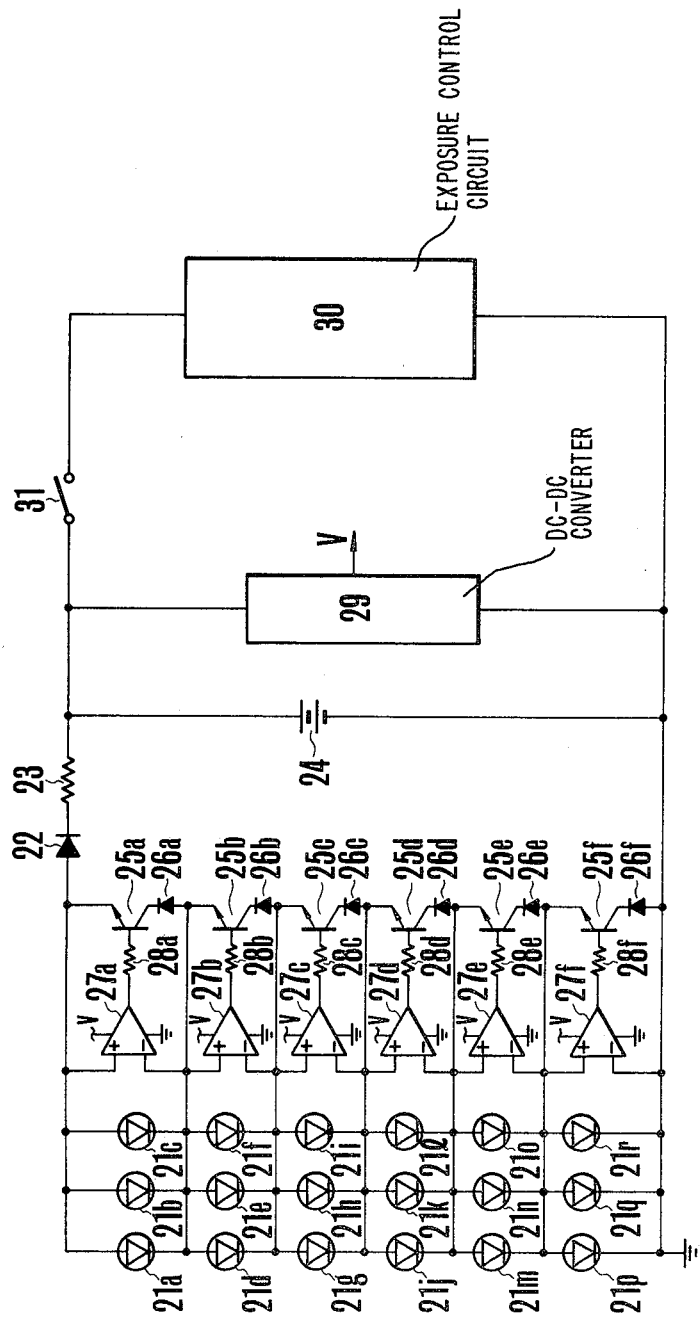
FIG. 6 shows a third embodiment of the electrical circuit in accordance with the present invention of the power source device of the camera in which the solar batteries of a series group contains three parallel batteries.

In FIG. 6, for example, 18 solar batteries 21a, 21b–21r are divided into six serial-connected groups, each consisting of three parallel-connected batteries, and circuits are provided to compare group to group and to short-circuit them. Elements having the same numerical designations as those in FIG. 5 are the same and, accordingly, an explanation concerning them is omitted here. In particular, the solar batteries 21a, 21b–21r are divided into six serial-connected groups 21a–21c, 21d–21f, 21g–21i, 21j–21l, 21m–21o, 21p–21r, each consisting of three parallel-connected batteries. These battery groups are connected to the transistors 25a, 25b–25f as well as the comparators 27a, 27b–27f.

Consequently, the two input terminals of the comparators 27a, 27b–27f have applied thereto the voltage level difference corresponding to the electromotive force of the battery groups 21a–21c, 21d–21f, 21g–21i, 21j–21l, 21m–21o, 21p–21r. As long as the voltage difference is larger than a certain determined value, the level of the output of the comparators 27a, 27b–27f is low so that the transistors 25a, 25b–25f are in the switched-off state. On the other hand, when the level difference between the two input terminals of the comparators 27a, 27b–27f is smaller than a certain determined value, the level of the output of the comparators 27a, 27b–27f is high so that the transistors 25a, 25b–25f are in the switched-on state. For example, when the electromotive force of the solar battery group 21d–21f is lowered, the level of the output of the comparator 27b is high. Thus, the transistor 25b is brought into the switched-on state so that the solar battery group 21d–21f is short-circuited by the emitter and the collector of the transistor 25b. Consequently, the current resulting from the electromotive force of the remaining solar batteries 21a–21c, 21g–21r flows through the transistor 26b in the switched-on state, wherein the secondary battery 24 is charged with this current.

Below, the fourth embodiment of the present invention will be explained in detail in accordance with FIGS. 7 and 8.

Figure 1:
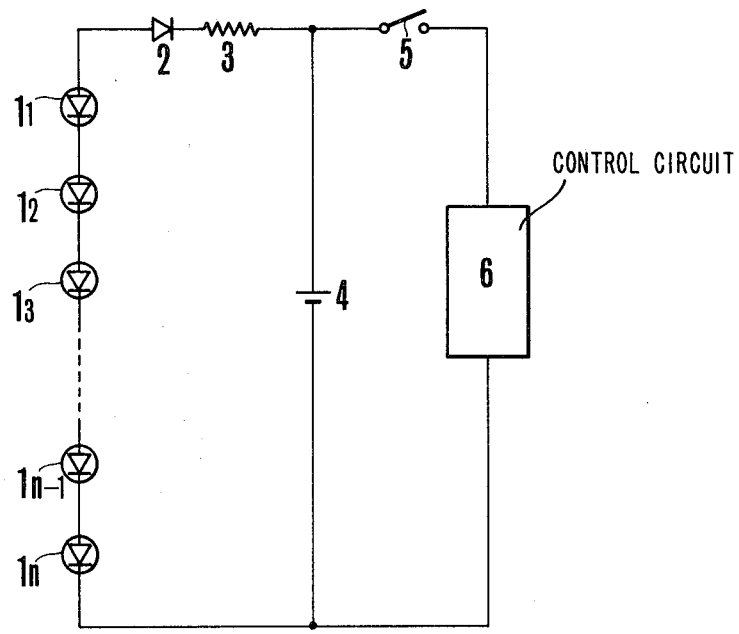
FIG. 1 shows an embodiment of the conventional circuit of the power source device of the camera in which the solar battery is built.
Figure 2:
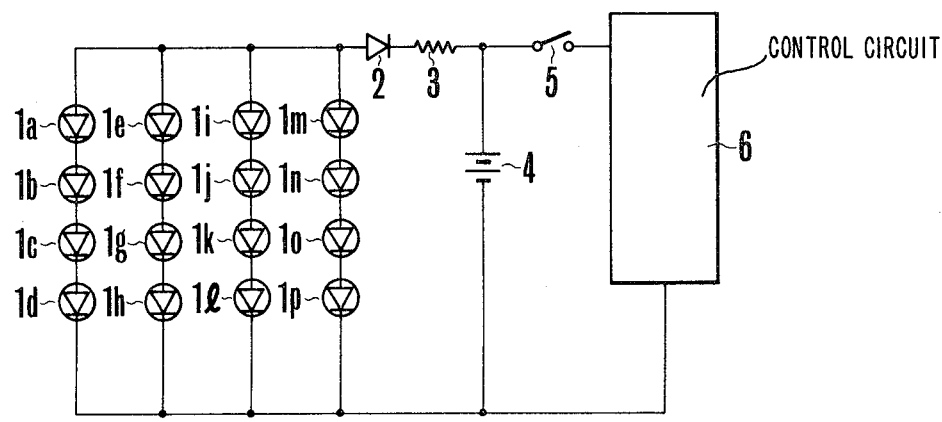
FIG. 2 shows another embodiment of the conventional circuit of the power source device of the camera in which the solar battery is built.
Figure 3:
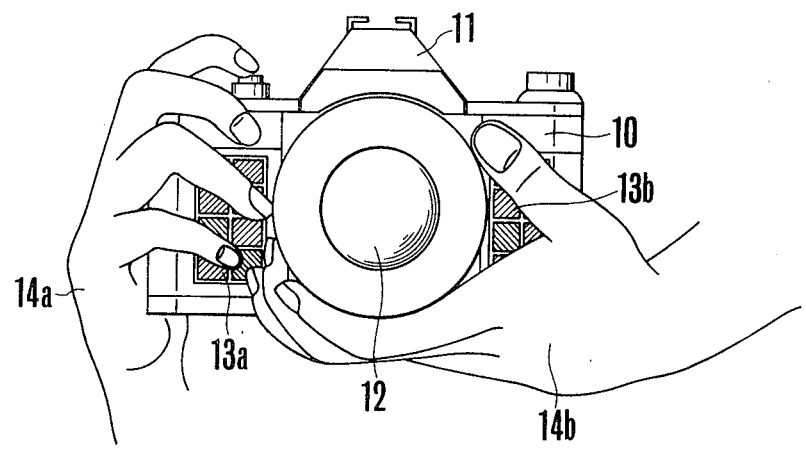
FIG. 3 shows the camera for showing the arrangement of the solar battery shown in FIGS. 1 and 2.
Figure 7:
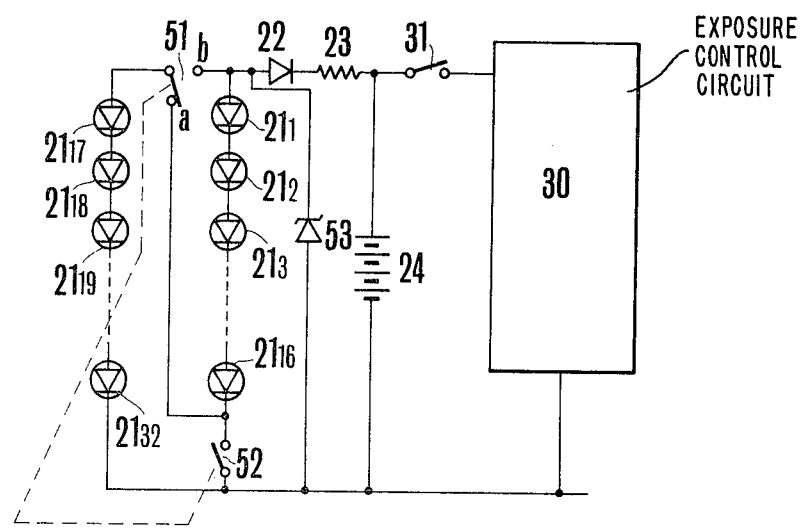
FIG. 7 shows a fourth embodiment of the electrical circuit in accordance with the present invention of the power source device of the camera in which the solar batteries can be connected in series or parallel.

In FIG. 7, for example, a group composed of 16 serial-connected solar batteries $21_1$, $21_2$–$21_{16}$ and another group composed of 16 serial-connected solar batteries $21_{17}$, $21_{18}$–$21_{32}$ are connected in series or in parallel by means of the switches 51 and 52. Again, elements having the same numerical designations as those in FIG. 4 are the same, and explanation concerning them is omitted here. Sixteen serial-solar batteries $21_1$, $21_2$–$21_{16}$ form a battery group, while 16 serial-connected solar batteries $21_{17}$, $21_{18}$–$21_{32}$ form another battery group. 51 is a change-over switch which is changeable between the contacts a and b while 52 is a switch operatively engaged with the change-over switch 51. Switch 52 is opened when the change-over switch 51 is connected to the contact a, while the switch 52 is closed when the change-over switch 51 is connected to the contact b. Element 53 is a Zener diode for over-charge prevention which is especially needed when the secondary battery is used.

Figure 8:
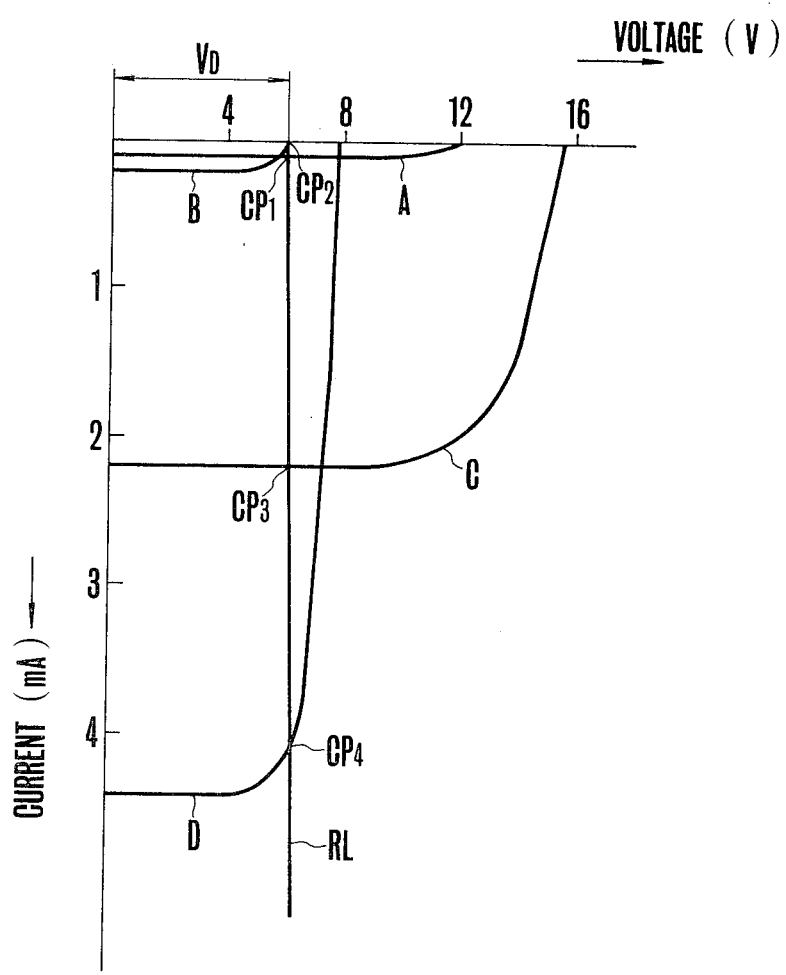
FIG. 8 shows the characteristics of the solar battery shown in FIG. 7.

FIG. 8 shows the characteristic curve and the load line of the solar battery groups $21_1$–$21_{16}$, $21_{17}$–$21_{32}$, where curve A relates to the case where the groups $21_1$–$21_{16}$ and $21_{17}$–$21_{32}$ are connected in series under 500 Lux, the curve B relates to the case where the groups are connected in parallel under 500 Lux, the curve C relates to the case where the groups are connected in series under 10,000 Lux and the curve D relates to the case where the groups are connected in parallel under 10,000 Lux. In the case of the serial connection under 500 Lux, the characteristic curve of the whole set of solar battery groups is represented by A. The secondary battery 24 is charged with the current corresponding to the crossing point $CP_1$ of the curve A with the load line RL. VD represents the terminal voltage of the secondary battery.

The charge current, when the solar battery groups $21_1$–$21_{16}$, $21_{17}$–$21_{32}$ are connected in parallel under 500 Lux, will now be considered. The change-over switch 51 is connected to side b and switch 52 is closed. The characteristic curve of the whole set of solar battery groups in this state is represented by B. That is, in this case, the current is twice as large as in the case of characteristic curve A and the voltage is half of the case of curve A. The operation point in this case is the crossing point $CP_2$ of the load line RL with the characteristic curve B of the solar battery group. Further, the charge current is smaller there than the charge current at the aforementioned operation point $CP_1$, as small as nearly zero. It is understood that under low brightness, larger charge current can be obtained in the case where the solar battery groups $21_1$–$21_{16}$, $21_{17}$–$21_{32}$ are connected in series than in the case where they are connected in parallel.

Now, consider the charge current in the case where the solar battery groups are connected in series and in parallel under high brightness. C represents the characteristic curve of the solar battery groups $21_1$–$21_{16}$, and $21_{17}$–$21_{32}$ are connected in series under 10,000 Lux. The operation point is represented by $CP_3$. In the drawing, D represents the characteristic curve of the whole set of solar battery groups when they are connected in parallel under 10,000 Lux. The operation point is represented by $CP_4$.

As is clear from the drawing, under high brightness, the charge current is larger in the case where the solar battery groups $21_1$–$21_{16}$, $21_{17}$–$21_{32}$ are connected in parallel than in the case where they are connected in series.

As is explained above, under low brightness, the charge current is larger in the case where the whole set of solar battery groups is connected in series, while it is lower in the case where the whole set of battery groups is connected in parallel.

Consequently, under low brightness, the switch 51 is manually connected to the contact a so as to open the switch 52 so that the solar battery groups $21_1$–$21_{16}$, $21_{17}$–$21_{32}$ are connected in series, while under high brightness, the switch 51 is manually connected to the contact b so as to close the switch 52 in such a manner that the solar battery groups $21_1$–$21_{16}$, $21_{17}$–$21_{32}$ are connected in parallel.

Below, the fifth embodiment of the present invention will be explained in detail in accordance with FIG. 9.

Figure 9:
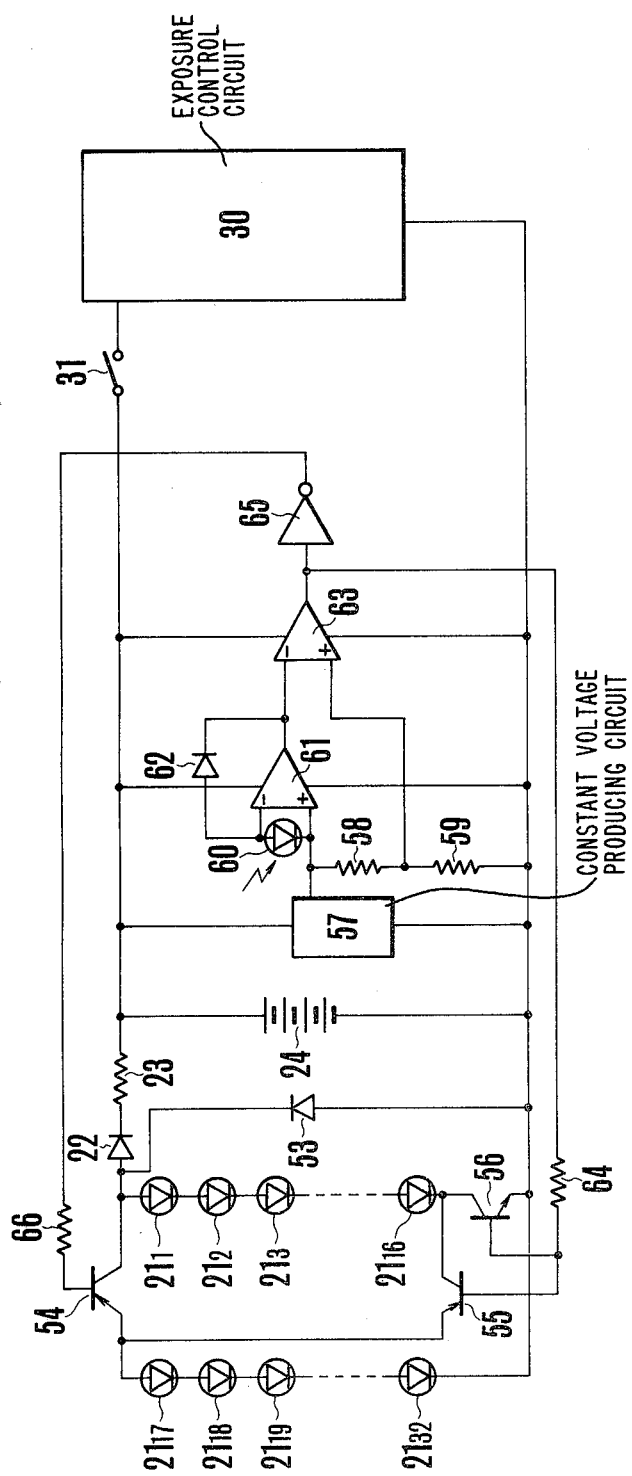
FIG. 9 shows a fifth embodiment of the electrical circuit in accordance with the present invention of the power source device of the camera in which the solar batteries are connected in accordance with brightness.

In FIG. 9, a solar battery group composed of, for example, 16 serial-connected solar batteries $21_1$, $21_2$–$21_{16}$ and another solar battery group composed of, for example, 16-serial connected solar batteries $21_{17}$, $21_{18}$–$21_{32}$ are automatically connected in series or in parallel in accordance with the brightness. In this connection, the elements having the same numerical designations as those in FIGS. 4 and 7 are the same, and their explanation is omitted here. 16 serial-connected solar batteries $21_1$, $21_2$–$21_{16}$ form one solar battery group, while 16 serial-connected solar batteries $21_{17}$, $21_{18}$–$21_{32}$ form the other. Elements 54, 55 and 56 are switching transistors for connecting these two solar battery groups in series or in parallel; element 57 is a constant voltage producing circuit; elements 58 and 59 are voltage dividing resistances for dividing the voltage output of the constant voltage producing circuit 57; element 60 is a light sensing element such as a silicon photocell; element 61 is an operational amplifier whose feedback circuit is provided with a logarithmic compression diode 62; and element 63 is the comparator for comparing the output of operational amplifier 61 with the voltage divided by the voltage dividing resistances 58 and 59. The output of the comparator 63 is applied to the base of the transistors 55 and 56 through the resistance 64 and also to the base of the transistor 54 through the inverter 65 and the resistance 66.

Below, the operation of the above-mentioned composition will be explained. Initially, the case where the brightness is low will be considered.

Because, at this time the amount of the light incident upon the light sensing element 60 is small, the output of the operational amplifier 61 is not lowered so much, being higher than the voltage divided by the voltage dividing resistances 58 and 59. Consequently, the level of the comparison circuit 63 is low so as to bring the transistor 55 into the switched-on state and the transistor 56 into the switched-off state. Further, the output of the comparison circuit 63 is inverted by means of the inverter 65 so as to be applied to the transistor 54, which is brought into the switched-off state. Thus, the solar battery groups $21_1$, $21_2$–$21_{16}$ and $21_{17}$, $21_{18}$–$21_{32}$ are connected in series. The secondary battery is charged by means of serial-connected solar battery groups.

On the other hand, in the case of high brightness, the amount of light incident upon the light sensing element 60 is large so that the output of the operational amplifier 61 is lowered considerably so that the output of the operational amplifier 61 is lower than the voltage divided by means of the voltage dividing resistances 58 and 59. Consequently, the level of the output of the comparison circuit 63 is high so as to bring the transistor 55 into the switched-off state and the transistor 56 into the switched-on state. Further, the output of the comparison circuit 63 is inverted by means of the inverter 65 and applied to the transistor 54 so as to bring the transistor 54 into the switched-on state. Thus, the solar battery groups $21_1$, $21_2$–$21_{16}$ and $21_{17}$, $21_{18}$–$21_{32}$ are connected in parallel. That is, the secondary battery is charged by means of the parallel-connected solar battery groups $21_1$, $21_2$–$21_{16}$ and $21_{17}$, $21_{18}$–$21_{32}$.

As explained above, under low brightness, the solar battery groups $21_1$, $21_2$–$21_{16}$ and $21_{17}$, $21_{18}$–$21_{32}$ are automatically connected in series so that a larger current can be obtained than in the case when they are connected in parallel, while under high brightness, the solar battery groups $21_1$, $21_2$–$21_{16}$ and $21_{17}$, $21_{18}$–$21_{32}$ are automatically connected in parallel in such a manner that a larger current can be obtained than in the case when they are connected in series. That is, under any brightness, an efficient charge can be carried out.

Figure 10:
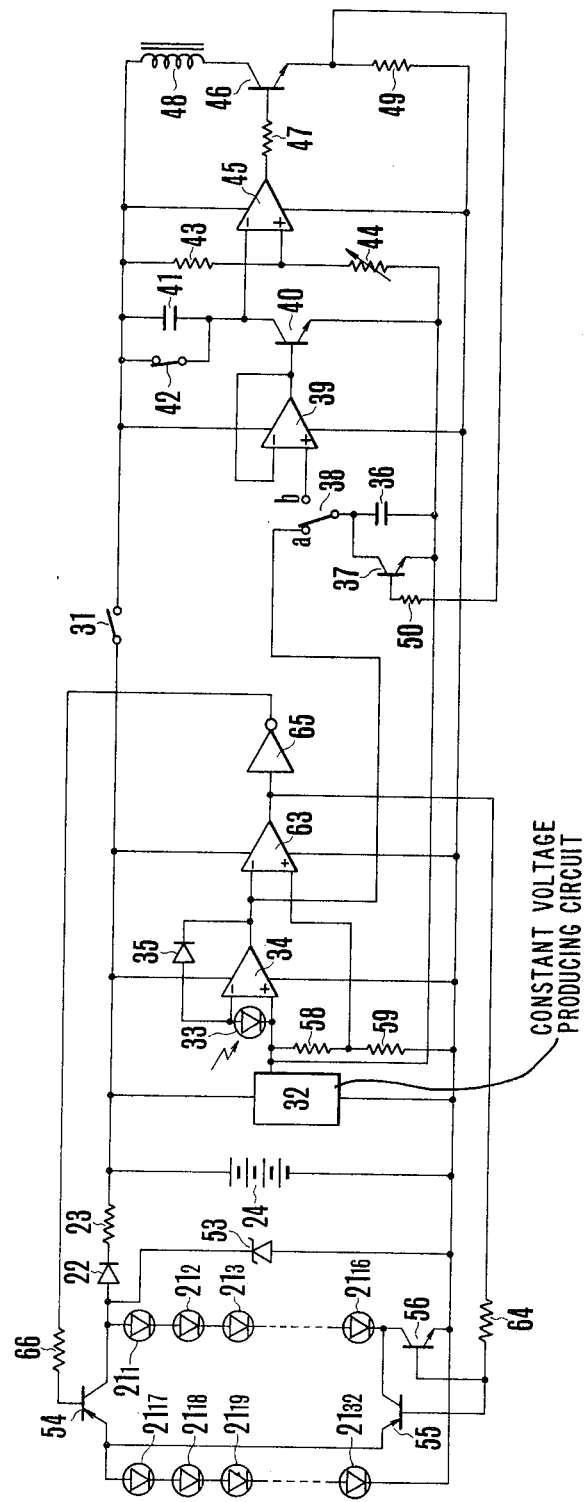
FIG. 10 shows the electrical circuit of the solar battery shown in FIG. 9, where the measuring circuit for connection change-over is used in common with the light measuring circuit of the exposure control circuit.

Further, although in the case of the present embodiment, the light measuring circuit of the exposure control circuit 30 and the measuring circuit for changing over the solar batteries are provided separately, it is also, as is shown in FIG. 10, possible to use one circuit in common. However, even in this case, the voltage dividing resistances 58 and 59, the comparator 63 and the inverter 65 are necessary. As is shown in FIG. 10, the constant voltage output of the constant voltage circuit 32 is divided by means of the voltage dividing resistances 58 and 59, so as to be compared with the output of the operational amplifier 38 by means of the comparator 63, whose output is applied to the transistors 55 and 56 through the resistance 64 and further to the transistors 54 through the inverter 65. The power source switch 31 is designed so as to open and close the buffer operational amplifier 39 and the comparator 45.

Below, the sixth embodiment of the present invention will be explained in detail in accordance with FIGS. 11 and 12.

Figure 11:
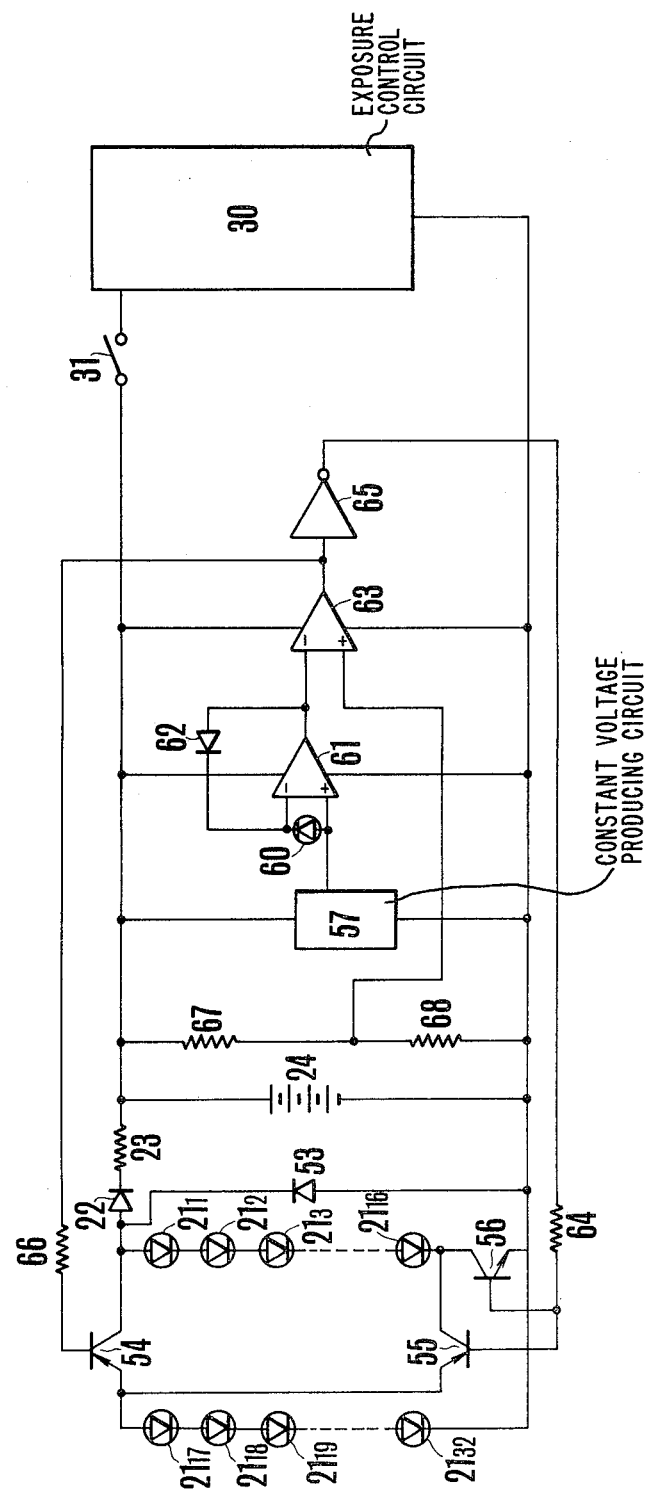
FIG. 11 shows a sixth embodiment of the electrical circuit in accordance with the present invention of the power source device of the camera in which the solar batteries are connected in accordance with the terminal voltage of a secondary battery and ambient brightness.

In FIG. 11, one solar battery group composed of, for example, 16 serial-connected solar batteries $21_1$, $21_2$–$21_{16}$ and the other group composed of, for example, 16 serial-connected batteries $21_{17}$, $21_{18}$–$21_{32}$ are automatically connected in series or parallel in accordance with the terminal voltage of the secondary battery 24 and the ambient brightness. In this discussion, the elements having the same numerical designations as those in FIG. 9 are the same and, accordingly, further explanation is omitted here.

Elements 67 and 68 are the voltage dividing resistances for dividing the terminal voltage of the secondary battery 24. The value of the resistances 67 and 68 is chosen relatively high and the level of the divided voltage is chosen a little higher than the voltage of the constant voltage circuit 57.

Further, the light sensing element 60 and the logarithmic compression diode 62 are connected in the reverse direction shown in FIG. 9. Further, the output of the comparator 63 is connected to the base of the transistor 54 through the resistance 66, while the output of the comparator 63 is connected to the base of the transistors 55 and 56 through the inverter 65. This differs from the case shown in FIG. 9. Further, the comparator 63 has applied to it the output of the operational amplifier 61 and the voltage divided by means of the voltage dividing resistances 67 and 68.

Figure 12:
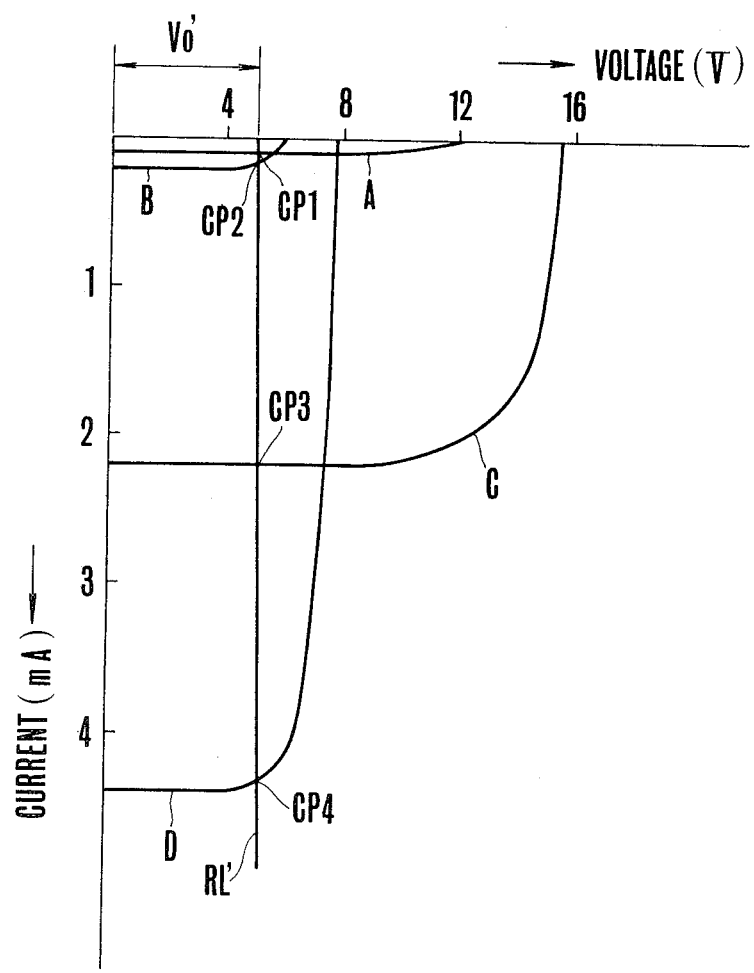
FIG. 12 shows the characteristics of the solar battery shown in FIG. 11.

FIG. 12 shows the load line and the characteristic curve of the solar battery groups $21_1$-$21_{16}$, $21_{17}$-$21_{32}$, where the terminal voltage of the secondary battery 24 is lowered. A, B, C and D in the drawing are the same as in FIG. 8. However, because the terminal voltage VD' of the secondary battery 24 is lower than shown in FIG. 8, the load line RL' assumes a position translated a little more to the left than that shown in FIG. 8.

Thus, the operation points $CP_1$, $CP_2$, $CP_3$ and $CP_4$ at the time assumes the position shown in the drawing. As is clear from this, either under 500 Lux or 10,000 Lux, a larger current can be obtained when the solar battery groups $21_1$-$21_{16}$ and $21_{17}$-$21_{32}$ are connected in parallel. However, although not shown in the drawing, it can be imagined that, at some point under 500 Lux, a larger current could be obtained when the solar battery groups are connected in series.

That is, when the terminal voltage of the secondary battery 24 is lowered due to consumption, it is necessary to compensate, that is, lower the brightness at which the connection of the battery groups $21_1$-$21_{16}$ and $21_{17}$-$21_{32}$ is to be altered.

On the other hand, when the terminal voltage of the secondary battery 24 is raised due to the increased amount charged, it is necessary to raise the brightness at which the connection is to be changed. Consequently, under low brightness, the amount of light incident upon the light sensing element 60 is small so that the output of the operational amplifier 61 is not so high. Consequently, the output of the operational amplifier 61 is lower than the voltage divided by means of the voltage dividing resistances 67 and 68. Thus, the level of the output of the comparison circuit 63 is high so as to bring the transistor 54 into the switched-off state. Further, the output of the comparison circuit 63 is inverted by means of the inverter 65 and applied to the transistors 55 and 56 so as to bring the transistor 55 into the switched-on state and the transistor 56 into the switched-off state. Thus, the solar battery groups $21_1$, $21_2$-$21_{16}$ and $21_{17}$, $21_{18}$-$21_{32}$ are connected in series. The secondary battery 24 is charged by means of the serial-connected solar batteries $21_1$, $21_2$-$21_{32}$.

In the case of high brightness, the amount of light incident upon the light sensing element 60 is large so that the output of the operational amplifier 61 is largely raised so as to be higher than the voltage divided by means of the voltage dividing resistances 67 and 68. Consequently, the level of the output of the comparison circuit 63 is low so as to bring the transistor 54 into the switched-on state. Further, the output of the comparison circuit 63 is inverted by means of the inverter 65 and applied to the transistor 55 and 56 so as to bring the transistor 55 into the switched-off state and the transistor 56 into the switched-on state. In this way, the solar battery groups $21_1$, $21_2$-$21_{16}$ and $21_{17}$, $21_{18}$-$21_{32}$ are connected in parallel. The secondary battery 24 is charged by means of the parallel-connected solar battery groups $21_1$, $21_2$-$21_{16}$ and $21_{17}$, $21_{18}$-$21_{32}$.

As explained above, in the case of low brightness, the solar battery groups $21_1$-$21_{16}$ and $21_{17}$-$21_{32}$ are automatically connected in series, while, in the case of high brightness, the solar battery groups $21_1$-$21_{16}$ and $21_{17}$-$21_{32}$ are automatically connected in parallel. Thus, along with the lowering of the terminal voltage of the secondary battery 24, the voltage dividing level of the voltage dividing resistances 67 and 68 is lowered so that, under the further lower brightness, the output of the comparison circuit 63 is inverted. That is, along with the lowering of the terminal voltage of the secondary battery 24, the brightness at which the serial connection of the solar battery groups $21_1$-$21_{16}$ and $21_{17}$-$21_{32}$ is changed into the parallel connection is lowered. Further, on the other hand, when the terminal voltage of the secondary battery 24 is raised, the brightness at which the serial connection of the solar battery groups $21_1$-$21_{16}$ and $21_{17}$-$21_{32}$ is changed over into the parallel connection is increased.

Figure 13:
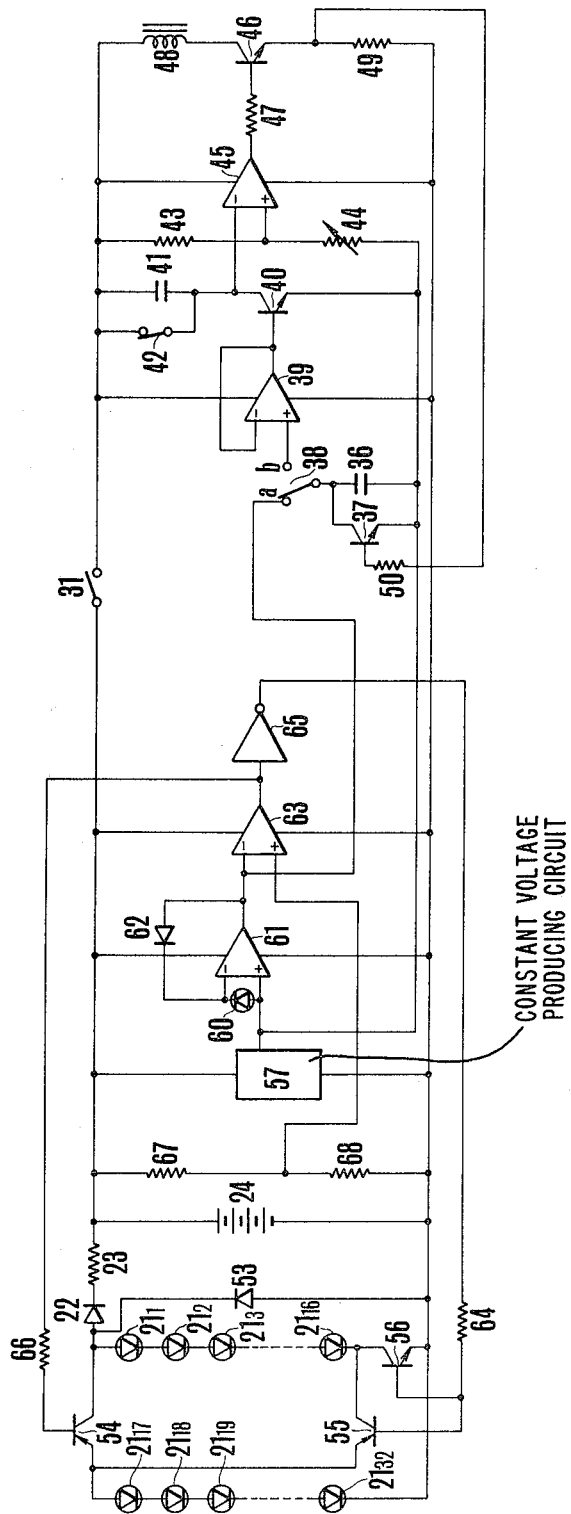
FIG. 13 shows the electrical circuit of the solar battery shown in FIG. 11, where the measuring circuit for connection change-over is used in common with the light measuring circuit of the exposure control circuit.

Although, in the case of the present embodiment, the light measuring circuit of the exposure control circuit 30 and the measuring circuit for changing over the connection of the solar batteries are provided separately, it is possible, as is shown in FIG. 13, to use the one circuit in common. However, even in this case, the voltage dividing resistances 67 and 68, the comparator 63 and the inverter 65 are needed.

The output of the voltage dividing resistances 67 and 68 is compared with the output of the operational amplifier 61 by means of the comparator 63, whose output is applied to the transistor 54 through the resistance 66 and further to the transistors 55 and 56 through the inverter 65 and the resistance 64. The power source switch 31 is designed so as to open and close the buffer operational amplifier 39 and the comparator 45.

Below, the seventh embodiment of the present invention will be explained in detail in accordance with FIG. 14.

Figure 14:
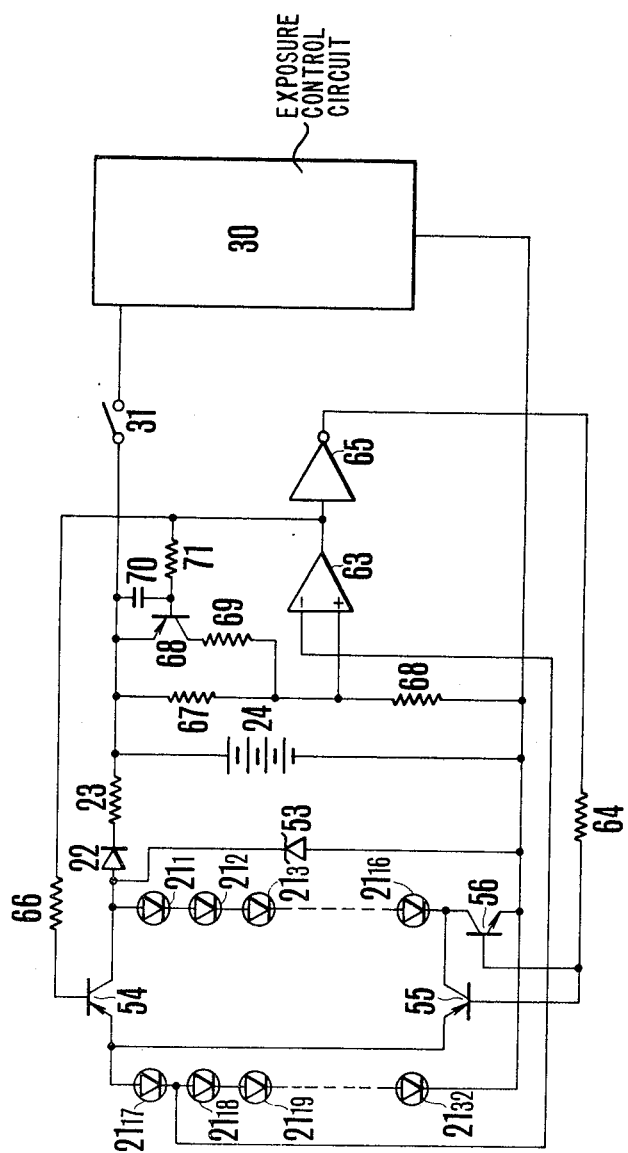
FIG. 14 shows a seventh embodiment of the electrical circuit in accordance with the present invention of the power source device of the camera in which the solar battery is built with compensation for potential change at switch over time.

In FIG. 14, one solar battery group composed of, for example, 16 serial-connected solar batteries $21_1$, $21_2$-$21_{16}$ and the other solar battery group composed of, for example, 16 serial-connected solar batteries $21_{17}$, $21_{18}$-$21_{32}$ are automatically connected in series or in parallel in accordance with the electromotive force of the solar batteries. In this connection, elements having the same numerical designation as those in FIG. 11 are the same, so that further explanation is omitted here.

To comparator 63, the voltage dividing point of the voltage dividing resistances 67 and 68 and the connecting point of the solar batteries $21_{17}$, $21_{18}$ are connected. To voltage dividing resistances 67, a circuit composed of transistor 68 and resistance 69, which are connected in series to each other, is connected in parallel, and a condenser 70 is connected between the base and the emitter of the transistor 68. Further, a resistance 71 is connected between the base of the transistor 68 and the comparator 63.

Consequently, in the case of low brightness, the potential at the connecting point of the solar batteries $21_{17}$, $21_{18}$ is low, that is, lower than the voltage dividing level of the voltage dividing resistances 67 and 68. Thus, the level of the output of the comparison circuit 63 becomes high so as to bring the transistor 54 into the switched-off state. Further, the output of the comparison circuit 63 is inverted by means of the inverter 65 and is applied to the transistors 55 and 56 so as to bring the transistor 55 into a switched-on state and the transistor 56 into a switched-off state. Thus, the solar battery groups $21_1$-$21_{16}$ and $21_{17}$-$21_{32}$ are connected in series. In this manner, the secondary battery is charged with the serial-connected solar batteries $21_1$-$21_{32}$.

In the case of high brightness, the potential at the connecting point of the solar batteries $21_{17}$, $21_{18}$ is high, that is, higher than the voltage dividing level of the voltage dividing resistances 67 and 68. Consequently, the level of the output of the comparison circuit 63 is low so as to bring the transistor 54 into the switched-on state. Further, the output of the comparison circuit 63 is inverted by means of the inverter 65 and applied to the transistors 55 and 56. Accordingly, the transistor 55 is brought into the switched-off state, while the transistor 56 is brought into the switched-on state. In this way, the solar battery groups $21_1$–$21_{16}$ and $21_{17}$–$21_{32}$ are connected in parallel in such a manner that the secondary battery 24 is charged by means of the parallel-connected solar battery groups $21_1$–$21_{16}$ and $21_{17}$–$21_{32}$.

Further, the transistor 68 serves to compensate the change of potential at the connecting point of the solar batteries $21_{17}$, $21_{18}$ taking place at the time at which the connection of the solar battery groups $21_1$–$21_{16}$, $21_{17}$–$21_{32}$ is changed over. That is, when, along with the change of brightness from the low state into the high state, the solar battery groups $21_1$–$21_{16}$ and $21_{17}$–$21_{32}$ are connected in parallel, the potential at the connecting point of the solar batteries $21_{17}$, $21_{18}$ is greatly increased. In order to overcome this difficulty, transistor 68 is brought into the switched-on state, being delayed from the time point at which the level of the output of the comparator 63 becomes low by the time constant of condenser 70. Accordingly, the potential at the voltage dividing point, which is the standard level of the comparator 63, is raised so that the brightness detection can be carried out on the same level even if the potential at the connecting point changes.

On the other hand, when the brightness becomes low, the solar battery groups are connected in series, so that the potential at the connecting point of the solar batteries $21_{17}$, $21_{18}$ is lowered and the level of the output of the comparator 63 is high so as to bring the transistor 68 into the switched-off state, and the potential at the voltage dividing point will be lowered.

Figure 15:
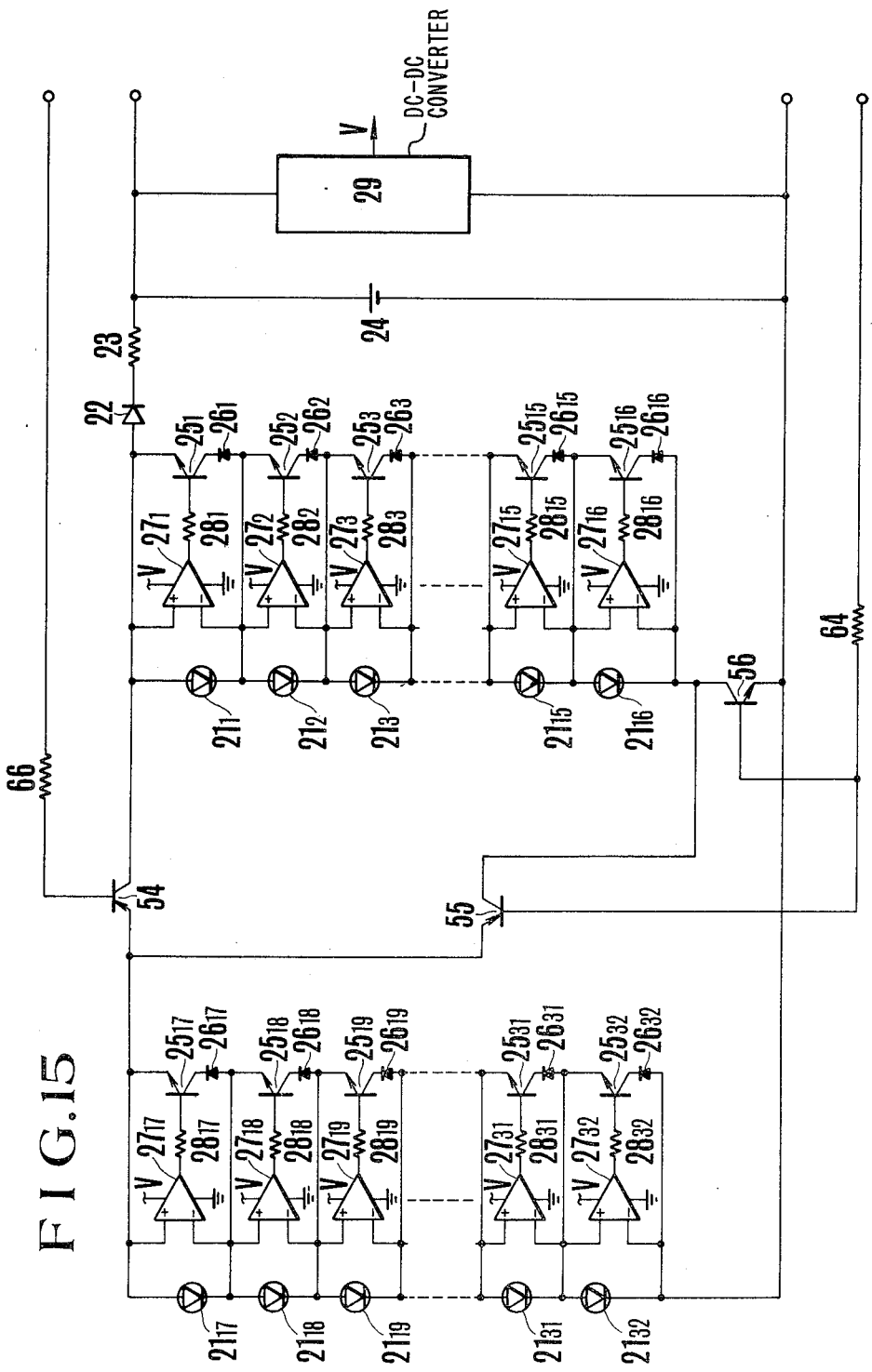
FIG. 15 shows the electrical circuit, where each solar battery shown in FIG. 14 is provided with the comparison and short-circuiting circuit shown in FIG. 4.

Further, in FIG. 15, the solar batteries $21_1$–$21_{32}$ in the power source circuit shown in FIGS. 9, 10, 11, 13 and 14 are provided with the comparison and short-circuiting circuit shown in FIG. 4. By providing the solar batteries $21_1$–$21_{32}$ with the transistors $25_1$–$25_{32}$, the diodes $26_1$–$26_{32}$, the comparators $27_1$–$27_{32}$ and the resistances $28_1$–$28_{32}$ in the above-mentioned way, even when the electromotive force of one or some of the solar batteries is lowered, the charge can be carried out effectively by means of the current due to the electromotive force of the remaining solar batteries. Thus, both terminals of the solar batteries whose electromotive force is lowered are short-circuited.

Below, the eighth embodiment of the present invention will be explained in detail in accordance with FIG. 16.

Figure 16:
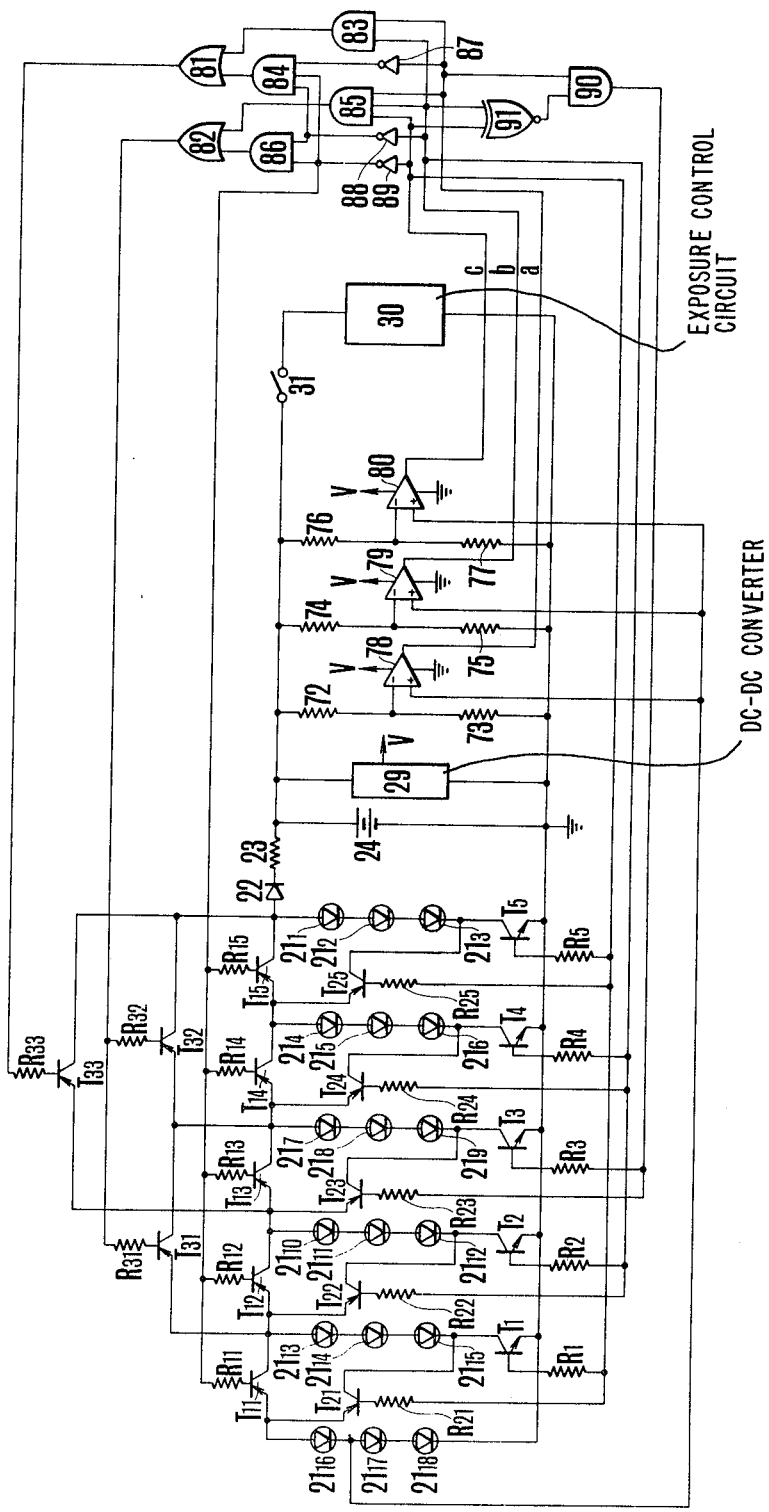
FIG. 16 shows an eighth embodiment of the electrical circuit in accordance with the present invention of the power source device of the camera in which series-parallel groups are changed over step by step.

In FIG. 16, six solar battery groups, each composed of, for example, three serial-connected solar batteries are formed. The connection of these six solar battery groups are changed over step by step between the total serial arrangement and the total parallel arrangement in accordance with the electromotive force of the solar battery. In this embodiment, those elements having the same numerical designations as those in FIG. 4 are the same and, accordingly, their explanation is omitted here. Elements $21_1$–$21_3$, $21_4$–$21_6$, $21_7$–$21_9$, $21_{10}$–$21_{12}$, $21_{13}$–$21_{15}$, $21_{16}$–$21_{18}$, respectively, represent three serial-connected solar batteries; elements $T_1$–$T_5$ are, respectively, the switching transistors connected between each solar battery group $21_1$–$21_3$, $21_4$–$21_6$, $21_7$–$21_9$, $21_{10}$–$21_{12}$, $21_{13}$–$21_{15}$, $21_{16}$–$21_{18}$ and the negative terminal of the secondary battery 24; elements $T_{11}$–$T_{15}$ are, respectively, the switching transistors for connecting the high level side of each solar battery group $21_1$–$21_3$, $21_4$–$21_6$, $21_7$–$21_9$, $21_{10}$–$21_{12}$, $21_{13}$–$21_{15}$, $21_{16}$–$21_{18}$ with each other; elements $T_{21}$–$T_{25}$ are, respectively, the switching transistors for connecting the high level side and the low level side of each solar battery group $21_1$–$21_3$, $21_4$–$21_6$, $21_7$–$21_9$, $21_{10}$–$21_{12}$, $21_{13}$–$21_{15}$, $21_{16}$–$21_{18}$ with each other; element $T_{31}$ is the switching transistor for connecting the high level side of the solar battery groups $21_7$–$21_9$, $21_{13}$–$21_{15}$ with each other; element $T_{32}$ is the switching transistor for connecting the high level side of the solar battery groups $21_1$–$21_3$, $21_7$–$21_9$ with each other; and elements 72 and 73, 74 and 75 and 76 and 77 are, respectively, the voltage dividing resistance for dividing the voltage at both terminals of the secondary voltage 24. The voltage dividing levels of these resistances 72 and 73, 74 and 75 and 76 and 77 differ from each other step by step. Elements 78, 79 and 80 are the comparators, to which are applied the voltage at the connecting point of the solar batteries $21_{16}$ and $21_{17}$ and the voltages divide by means of the voltage dividing resistances 72 and 73, 74 and 75 and 76 and 77. Element 81 is the OR gate whose output is delivered to the transistor $T_{33}$ through the resistance $R_{33}$, 82 is the OR gate whose output is delivered to the transistors $T_{31}$ and $T_{32}$ through the resistances 31 and 32, elements 83 and 84 are the AND gates whose output is delivered to the OR gate 81, and elements 85 and 86 are the AND gates whose output is delivered to the OR gate 82. The output of comparators 78 and 79 is delivered to AND gate 83 and the output of the comparators 78, 79 and 80 is applied to through the inverters 87, 88 and 89 to AND gate 84. Further, to AND gate 85, the output of the comparators 78, 79 and 80 is applied and to AND gate 86, the output of the comparators 79 and 80 is applied through inverters 88 and 89. The output of the comparator 80 is applied to the base of the transistors $T_{11}$, $T_{12}$, $T_{13}$, $T_{14}$ and $T_{15}$ through the inverter 89 and the resistances $R_{11}$, $R_{12}$, $R_{13}$, $R_{14}$ and $R_{15}$. Further, the output of the comparator 80 is applied to the base of the transistors $T_1$, $T_5$, $T_{21}$ and $T_{25}$ through the resistances $R_1$, $R_5$, $R_{21}$ and $R_{25}$. The output of the comparator 79 is applied to the base of the transistors $T_2$, $T_4$, $T_{22}$ and $T_{24}$ through the resistances $R_2$, $R_4$, $R_{22}$ and $R_{24}$. 90 is the AND gate whose output is applied to the transistors $T_3$ and $T_{23}$ through the resistances $R_3$ and $R_{23}$. To this AND gate 90, the output of the comparator 78 and that of the exclusive NOR gate 91 are applied. To exclusive NOR gate 91, the output of the comparators 79 and 80 is applied.

Below, the operation of the above-mentioned arrangement will be explained.

First, the case when the brightness is low will be explained. In this case, the potential at the connecting point of the solar batteries $21_{16}$ and $21_{17}$ is remarkably low, that is, lower than the voltage dividing level of the voltage dividing resistances 72 and 73, 74 and 75, 76 and 77. Consequently, the level of all of the outputs of the comparators 78, 79 and 80 is low. Thus, the level of the output of the AND gate 90 is also low, and all of the transistors $T_{21}$–$T_{25}$ are brought into the switched-on state while all of the transistors $T_1$–$T_5$ are brought into the switched-off state. Further, the output of the comparator 80 is inverted by means of the inverter 89 and delivered to the transistors $T_{11}$–$T_{15}$ so that all of the transistors $T_{11}$–$T_{15}$ are in the switched-off state. The output of the comparators 78, 79 and 80 is inverted by means of the inverters 87, 88 and 89 and delivered to the AND gate 84, whose output is on the high level, while the output of the comparators 79 and 80 is inverted by means of the inverters 88 and 89 and delivered to the AND gate 86, whose output is on the high level. Thus, the level of the output of the OR gates 81 and 82 is high, so that all of the transistors $T_{31}$-$T_{33}$ are in the switched-off state. Thus, all of the solar battery groups $21_1$-$21_3$, $21_4$-$21_6$, $21_7$-$21_9$, $21_{10}$-$21_{12}$, $21_{13}$-$21_{15}$, $21_{16}$-$21_{18}$ are connected in series. In this manner, the secondary battery 24 is charged by means of the serial-connected solar batteries $21_1$-$21_{18}$.

The case when the brightness is a little higher will be explained. In this case, the potential at the connecting point of the solar battery $21_{16}$, $21_{17}$ is a little low, that is, higher than the voltage dividing level of the voltage dividing resistances 72 and 73, but lower than the voltage dividing level of the voltage dividing resistances 74, 75 and 76 and 77. Consequently, the level of the output of the comparator 78 is high, while the level of the output of the comparators 79 and 80 is low. Thus, the level of the output of the AND gate 90 is high so that the transistor $T_3$ is brought into the switched-on state while the transistor $T_{23}$ is brought into the switched-off state. Further, the transistors $T_{21}$, $T_{22}$, $T_{24}$ and $T_{25}$ are brought into the switched-on state, while the transistors $T_1$, $T_2$, $T_4$ and $T_5$ are brought into the switched-off state. Further, the output of the comparator 80 is inverted by means of the inverter 89 and applied to the transistors $T_{11}$-$T_{15}$ so that all of the transistors $T_{11}$-$T_{15}$ are in the switched-off state. Because the level of the output of the comparator 79 is low, the level of the output of the AND gate 83 is low, while because the high level output of the comparator 78 is inverted by means of the inverter 87 and delivered to the AND gate 84, the level of the output of the AND gate 84 is low. Thus, the level of the output of the OR gate 81 is low. Further, the output of the comparators 79 and 80 is inverted by means of the inverters 88 and 89 and delivered to the AND gate 86, so that the level of the output of the AND gate 86 is high in such a manner that the level of the output of the OR gate 82 is high. Thus, transistors $T_{31}$, $T_{32}$ are in the switched-off state, while the transistor $T_{33}$ is in the switched-on state. The solar battery groups $21_1$-$21_3$, $21_4$-$21_6$, $21_7$-$21_9$ are, thus, connected in series, and the solar battery groups $21_{10}$-$21_{12}$, $21_{13}$-$21_{15}$, $21_{16}$-$21_{18}$ are connected in series. The three serial-connected solar battery groups $21_1$-$21_9$ are connected in parallel to the three serial-connected solar groups $21_{10}$-$21_{18}$. That is, the secondary battery 24 is charged with nine serial-connected solar batteries $21_1$-$21_9$ and nine serial-connected solar batteries $21_{10}$-$21_{18}$, and battery group $21_1$-$21_9$ is connected in parallel to group $21_{10}$-$21_{18}$.

Now, the case when the brightness is still higher will be explained. In this case, the potential at the connecting point between the solar batteries $21_{16}$-$21_{17}$ is still higher, that is, higher than the voltage dividing level of the voltage dividing resistances 72 and 73, and 74 and 75, but lower than the voltage dividing level of the voltage dividing resistances 76 and 77. Thus, the level of the output of the comparators 78 and 79 is high, while the level of the output of the comparator 80 is low. Further, the level of the output of the AND gate 90 is low, so that the transistors $T_{21}$, $T_{23}$ and $T_{25}$ are in the switched-on state while the transistors $T_1$, $T_3$ and $T_5$ are in the switched-off state. Further, the transistors $T_2$ and $T_4$ are in the switched-on state, while the transistors $T_{22}$ and $T_{24}$ are in the switched-off state. The output of the comparator 80 is inverted by means of the inverter 89 and delivered to the transistors $T_{11}$-$T_{15}$ so that all of the transistors $T_{11}$-$T_{15}$ are in the switched-off state. The output of the comparators 78 and 79 are delivered to the AND gate 83, whose output is on the high level in such a manner that the level of the output of the OR gate 81 becomes high. Further, because the level of the output of the comparator 80 is low, the level of the output of the AND gate 85 is low. Also, because the high level output of the comparator 79 is inverted by means of the inverter 88 and delivered to the AND gate 86, the level of the output of the AND gate 86 is low. Thus, the transistors $T_{31}$ and $T_{32}$ are brought into the switched-on state, while the transistor $T_{33}$ is brought into the switched-off state. Consequently, the solar battery groups $21_1$-$21_3$ and $21_4$-$21_6$, $21_7$-$21_9$ and $21_{10}$-$21_{12}$, $21_{13}$-$21_{15}$ and $21_{16}$-$21_{18}$ are, respectively, connected in series. The two thus serial-connected solar battery groups $21_1$-$21_3$ and $21_4$-$21_6$, $21_7$-$21_9$ and $21_{10}$-$21_{12}$ and $21_{13}$-$21_{15}$ and $21_{16}$-$21_{18}$ are connected in parallel to each other. In this manner, the secondary battery 24 is charged by means of the six serial-connected solar batteries $21_1$-$21_6$, $21_7$-$21_{12}$ and $21_{13}$-$21_{18}$, and the solar batteries $21_1$-$21_6$, $21_7$-$21_{12}$ and $21_{13}$-$21_{18}$ are connected in parallel to each other.

Now, the case where the brightness is high will be explained. In this case, the potential at the connecting point $21_6$-$21_{17}$ is remarkably high, that is, higher than the voltage dividing level of the voltage dividing resistances 72 and 73, 74 and 75, and 76 and 77. Thus, the level of the output of the comparators 78, 79 and 80 is high. Thus, the level of the output of the AND gate 90 is also high so that all of the transistors $T_{21}$-$T_{25}$ are in the switched-off state and all of the transistors $T_1$-$T_5$ are in the switched-on state. Further, the output of the comparator 80 is inverted by means of the inverter 89 and delivered to the transistors $T_{11}$-$T_{15}$, so that all of the transistors $T_{11}$-$T_{15}$ are in the switched-on state. The output of the comparators 78, 79 and 80 is applied to the AND gate 85, so that the level of the output of the AND gate 85 is high, and the output of the comparators 78 and 79 is applied to the AND gate 83, so that the output of the AND gate 83 is high. The level of the output of the OR gates 81 and 82 is therefore high, and all of the transistors $T_{31}$-$T_{33}$ are in the switched-off state. Consequently, all of the solar battery groups $21_1$-$21_3$, $21_4$-$21_6$, $21_7$-$21_9$, $21_{10}$-$21_{12}$, $21_{13}$-$21_{15}$ and $21_{16}$-$21_{18}$ are connected in parallel. In this manner, the secondary battery 24 is charged by means of the thus parallel-connected solar battery groups $21_1$-$21_3$, $21_4$-$21_6$, $21_7$-$21_9$, $21_{10}$-$21_{12}$, $21_{13}$-$21_{15}$ and $21_{16}$-$21_{18}$.

Figure 17:
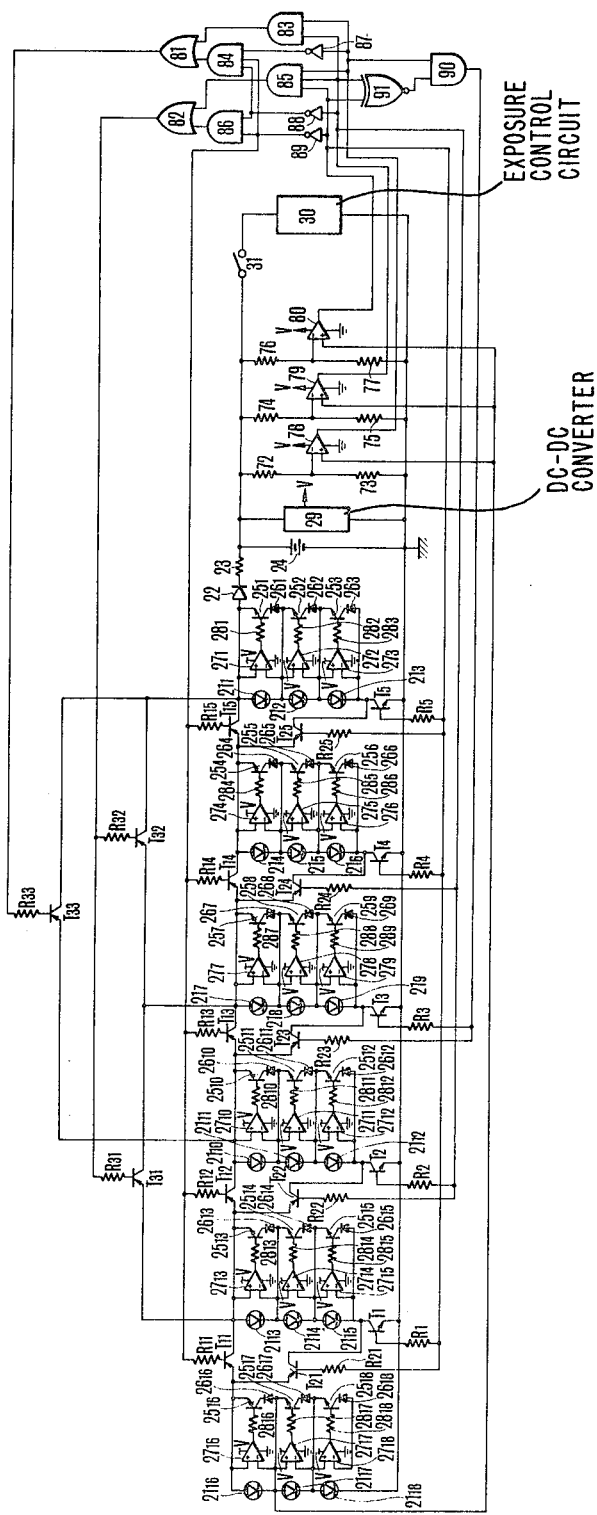
FIG. 17 shows the electrical circuit, where each solar battery shown in FIG. 16 is provided with the comparison and short-circuiting circuit shown in FIG. 4.

In FIG. 17, each solar batteries $21_1$-$21_{18}$ of the power source circuit shown in FIG. 16 is provided with the comparison and short-circuiting circuit shown in FIG. 4. By providing each solar battery $21_1$-$21_{18}$ with the transistor $25_1$-$25_{18}$, the diode $26_1$-$26_{18}$, the comparator $27_1$-$27_{18}$ and the resistance $28_1$-$28_{18}$ in the above-mentioned way, even if the electromotive force of one or some solar batteries were lowered, the charge can be carried out effectively by means of the current resulting from the electromotive force of the remaining solar batteries by short-circuiting both terminals of the solar batteries whose electromotive force is lowered.

Below, the ninth embodiment of the present invention will be explained in detail in accordance with FIGS. 18 and 19.

Figure 18:
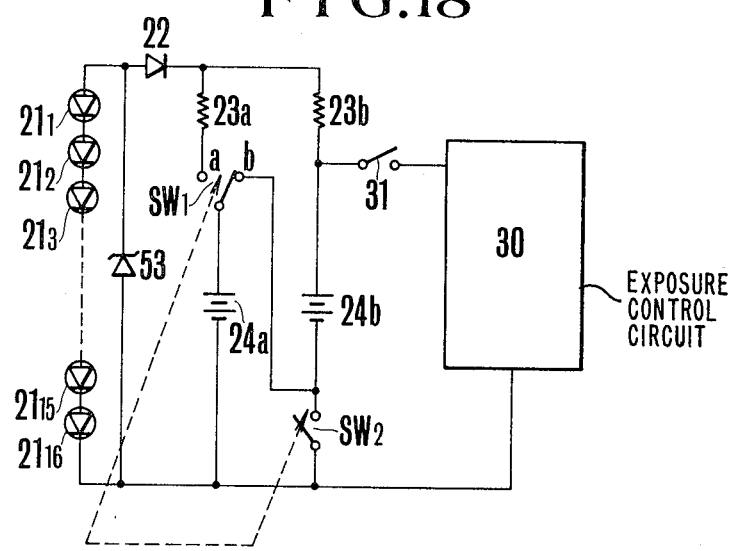
FIG. 18 shows a ninth embodiment of the electrical circuit in accordance with the present invention of the power source device of the camera in which the secondary batteries can be connected in series or parallel.

In FIG. 18, the secondary batteries 24a and 24b are connected in series or in parallel by means of switches $SW_1$ and $SW_2$. In this arrangement, elements having the same numerical designations as those in FIG. 7 are the same.

Elements $21_1$–$21_{16}$ are, for example, 16 serial-connected solar batteries; element 24a is a secondary battery unit composed of, for example, two serial-connected secondary batteries of 1.5 V; element 24b is a secondary battery unit composed of, for example, two serial-connected secondary batteries of 1.5 V; elements 23a and 23b are charge current limiting resistances; and elements $SW_1$ and $SW_2$ are switches for serial or parallel connection to the secondary battery units. $SW_1$ is a change-over switch-changeable between the contacts a and b, being operatively engaged with the switch $SW_2$ so that, when the change-over switch $SW_1$ is connected to the contact a, the switch $SW_2$ is closed and when the switch $SW_1$ is connected to the contact b, the switch $SW_2$ is opened.

Consequently, when under low brightness the change-over switch $SW_1$ is connected to the contact a, the switch $SW_2$ is closed so that the two secondary battery units 24a and 24b each consist of two serial-connected secondary batteries. The electromotive force of each secondary battery unit is nearly 3 V so that the load line is represented by RLP in FIG. 19. In this drawing, the resistance in the diode 22 is eliminated. (1) in the drawing represents the characteristic curve of the solar battery groups $21_1$–$21_{16}$ under low brightness of 500 Lux, and the crossing point $CP_2$ of the characteristic curve (1) with the load line RLP is the operating point in this case. The charge current corresponding to this point runs through the two parallel-connected secondary battery units 24a and 24b.

Consider now the charge current when, under the same brightness, the two secondary battery units 24a and 24b are connected in series. In this case, the change-over switch $SW_1$ is connected to the contact b so as to open the switch $SW_2$. The electromotive force of all the secondary batteries is nearly 6 V, so that the load line, then, is represented by RLS in the drawing. That is, in this case, the aforementioned load line RLP is translated to the right by 3 V. The operation point, then, is the crossing point $CP_1$ of the load line RLS with the characteristic curve of the solar battery group $21_1$–$21_{16}$ and the charge current is nearly zero. That is, under low brightness, a larger charge current can be obtained than when the secondary battery groups 24a and 24b are connected in parallel.

Now, consider the charge current when, under high brightness, the secondary battery units 24a and 24b are connected in series or in parallel. (2) in FIG. 19 represents the characteristic curve of the solar battery groups $21_1$–$21_{16}$ under 10,000 Lux. Consequently, the operation point when the secondary batteries 24a and 24b are connected in series is represented by $CP_3$, while the operation point when they are connected in parallel is represented by $CP_4$. As is clear from the above, the charge current supplied from the solar battery groups $21_1$–$21_{16}$ is larger when the secondary batteries 24a and 24b are connected in parallel.

However, in the case when the batteries 24a and 24b are connected in parallel, the current for charging the individual secondary battery is half the charge current obtained at the operation point $CP_4$. However, in the case when the batteries 24a and 24b are connected in series, the current obtained at the operation point $CP_3$ serves as the charge current for the individual secondary batteries 24a and 24b. That is, under high brightness, a larger charge current can be obtained when the secondary batteries 24a and 24b are connected in series.

In particular, under low brightness, switch $SW_1$ is manually connected to the contact a so as to close the switch $SW_2$ so that the secondary batteries 24a and 24b are connected in parallel. Under high brightness, the switch $SW_1$ is manually connected to the contact b so as to open the switch $SW_2$ so that they are connected in series.

Figure 19:
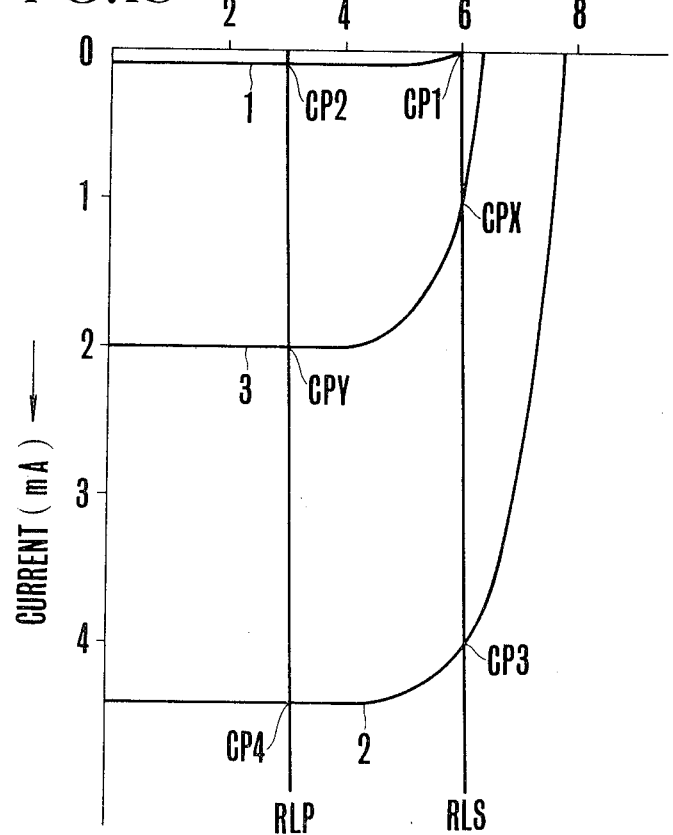
FIG. 19 shows the characteristics of the solar battery shown in FIG. 18.

The curve (3) in FIG. 19 represents the characteristics of the solar batteries $21_1$–$21_{16}$ under X Lux, whereby the same charge current can be obtained irrespective of whether the secondary batteries 24a and 24b are connected in series or in parallel. That is, the operation point when the secondary batteries 24a and 24b are connected in series is CPX, and when they are connected in parallel, the operation point is CPY. The charge current corresponding to the operation point CPY is twice as much as that corresponding to the operation point CPX. As is explained before, the charge current for the individual secondary battery when the batteries 24a and 24b are connected in parallel is half the charge current corresponding to the operation point CPY. That is, the charge current for the individual secondary battery is the same regardless of the method of connection.

Below, the tenth embodiment of the present invention will be explained in detail in accordance with FIGS. 20 and 21.

Figure 20:
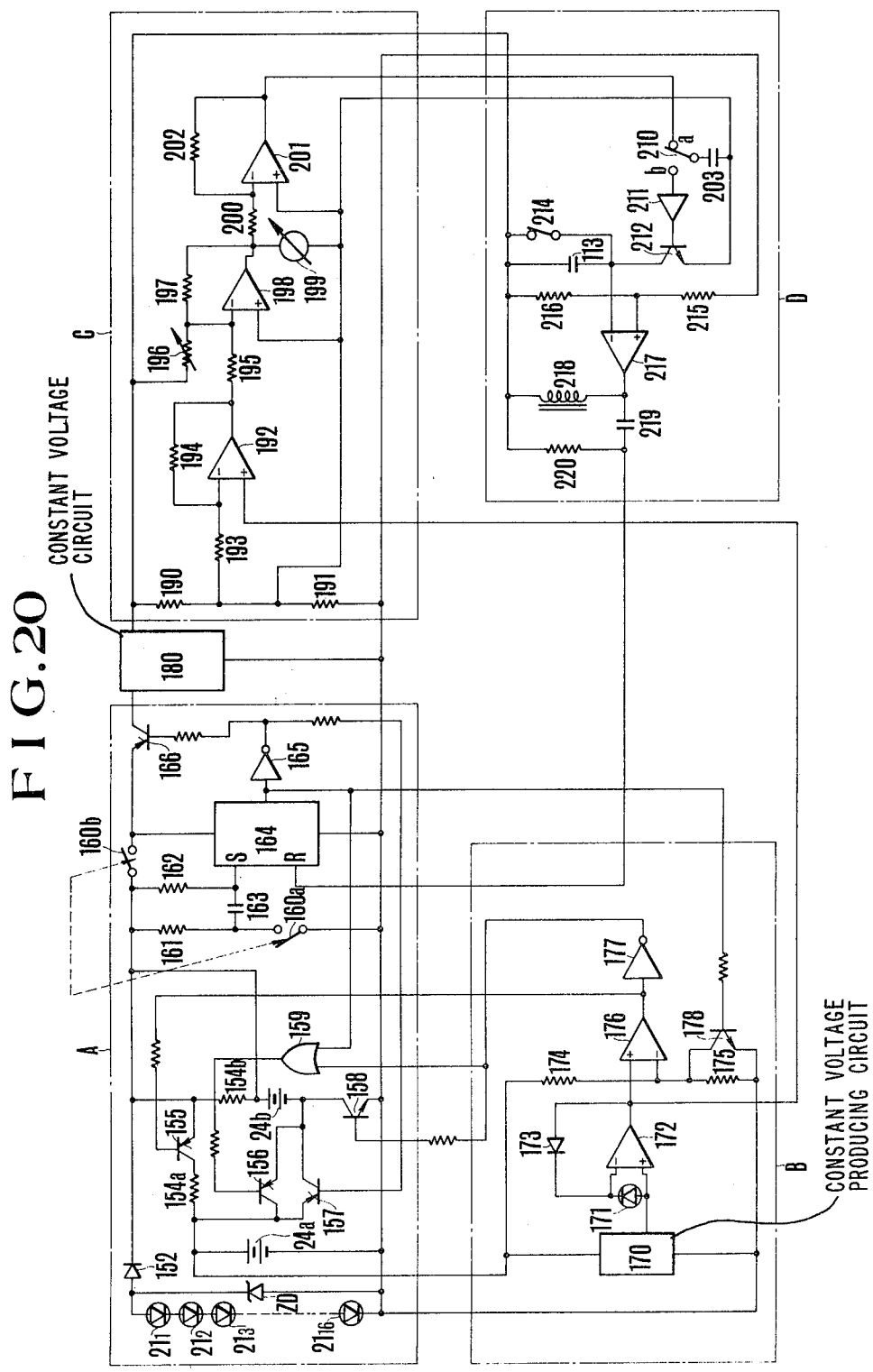
FIG. 20 shows a tenth embodiment of the electrical circuit in accordance with the present invention of the power source device of the camera in which the secondary batteries are connected in accordance with brightness.

In FIG. 20, the secondary batteries 24a and 24b are automatically connected in series or in parallel in accordance with the brightness.

In the case of the present embodiment, the detection element for the brightness serves at the same time as the light sensing element for the light measurement of the camera, while the camera itself is a TTL automatic exposure control single lens reflex camera with priority on aperture value.

In the drawing, A is the power source circuit, B is the light measuring and brightness detecting circuit, C is the calculation circuit and D is the tail shutter curtain control circuit. In the power source circuit A, elements $21_1$–$21_{16}$ are 16 serial-connected solar battery groups; element 152 is the nonreturn diode; element ZD is the over-charge prevention Zener diode; elements 24a and 24b are, respectively, a secondary battery composed of two serial-connected units; and elements 154a and 154b are, respectively, a charge current limiting resistance. Elements 155, 156, 157 and 158 are switching transistors; 159 is an OR gate; elements 160a and 160b are, respectively, a normally-opened switch to be closed with the first stroke of the shutter button; elements 161, 162 and 163 are the resistances and condenser for constituting a differentiating circuit; element 164 is the RS flip-flop circuit; element 165 is the inverting circuit connected to the output of 164; and element 166 is the power supply switching transistor.

In the light measuring and brightness detection circuit B, element 170 is a constant voltage producing circuit; element 171 is a light sensing element such as a silicon photocell; element 172 is an operational amplifier and element 173 is a logarithmic compression diode inserted in the feedback circuit of 172. Elements 172 and 173 constitute an amplifier for the silicon photocell. Element 176 is the operational amplifier constituting a comparison circuit and elements 174 and 175 are the voltage dividing high value resistances, whose voltage dividing point determines the voltage level of the inverting input terminal of the comparison circuit 176. Element 177 is an inverting circuit connected to the output circuit of 176, and element 178 is a switching transistor connected in parallel with the resistance 175. The light measuring and brightness detection circuit B is driven by the 3 V power source composed of the secondary battery 24a. Element 180 is a constant voltage circuit.

In the calculation circuit C, elements 190 and 191 are voltage dividing resistances and element 192 is an operational amplifier for constituting a non-inverting amplifier together with the resistances 193 and 194.

Element 198 is an operational amplifier, which constitutes an additional amplifier together with the resistances 195 and 197 and the variable resistance 196. Element 199 is a measured light value display meter connected to the output of the operational amplifier 198. Element 201 is an operational amplifier, which constitutes the non-inverting amplifier together with the resistances 200 and 202. Element 203 is a memory condenser for storing the measured light value, being connected to the output terminal of the operational amplifier 201. In the tail shutter curtain control circuit D, element 210 is the change-over switch changeable from the side a to the side b simultaneously with the start of operation of the mirror of the single lens reflex camera and is normally connected to side a. Element 211 is a buffer circuit; element 212 is a logarithmical elongation transistor; element 213 is a timing condenser connected to the collector of transistor 212; and element 214 is the normally closed count start switch connected in parallel to the timing condenser 213. Switch 214 is opened in synchronization with the start of the leading shutter curtain. Element 217 is an operational amplifier constituting a comparison circuit and elements 215 and 216 are the voltage dividing resistances for setting the standard voltage level for the comparison circuit. Element 218 is the tail shutter curtain control magnet connected to the output of the comparison circuit 217 and elements 219 and 220 are a condenser and resistance constituting a differentiating circuit. The output of the differentiating circuit is connected to the reset terminal of the RS flip-flop circuit 164 in the power source circuit A.

Below, the operation of the above-mentioned arrangement will be explained in accordance with FIG. 20. First, the case when the brightness is low will be explained. At this time, the amount of the light incident upon the light sensing element 171 in the light measuring and brightness detection circuit is small so that the output power of the operational amplifier 172 is not so great. Thus, the voltage level at the non-inverting input terminal of the comparison circuit 176 is lower than that of the inverting input terminal. Accordingly, the output level of the comparison circuit is low, while that of the inverting circuit 177 is high. Thus, the switching transistors 155 and 158 in the power source circuit A are brought into the switched-on state. Further, because the level of the output of the inverting circuit 177 is high, the level of the output of the OR gate 159 is also high, so that the switching transistor 156 is brought into the switched-off state. Further, because the level of the output of the RS flip-flop circuit 164 is low before the shutter button 164 is operated, the level of the output of the inverting circuit 165 is high, so that the switching transistor 157 is brought into the switched-off state. That is, in the case of low brightness, the switching transistors 155 and 158 are in the switched-on state, while the transistors 156 and 157 are in the switched-off state. In this state, the secondary batteries 24a and 24b are connected in parallel.

In this state, the current from the solar batteries $21_1$–$21_{16}$ charges the secondary battery 24b through the non-return diode 152 and the resistance 154b, on the one hand, and the secondary battery 24a through the non-return diode 152, the switching transistor 155 and the resistance 154a, on the other hand.

Below, the operation when the brightness is high will be explained.

Because, at that time, the amount of light incident upon the light sensing element 171 is large, the output level of the operational amplifier 172 is remarkably high so that the level at the non-inverting input terminal of the comparison circuit 176 becomes higher than the level at the inverting input terminal. Accordingly, the output of the operational amplifier 176 is inverted to a high level, and the output of the inverting circuit 177 is inverted to a low level. Thus, the aforementioned switching transistors 155 and 158 are brought into the switched-off state. Further, the level at the two input terminals of the OR gate 159 is low, so that the level at the output terminal is also low so as to bring the switching transistor 156 into the switched-on state. Further, in the same way as in the case when the brightness is low, the output level of the inverting circuit 165 is high and the switching transistor 157 is in the switched-off state. That is, when the brightness is high, the switching transistors 155, 157 and 158 are in the switched-off state, and only transistor 156 is in the switched-on state. Thus, the current due to the electromotive force of the solar battery groups $21_1$–$21_{16}$ runs through the secondary battery 24b, the switching transistor 156 and the secondary battery 24a so as to charge the batteries 24a and 24b.

Further, the present embodiment has the following advantage. That is, during the operation of the load circuit at the side of the camera, the secondary batteries 24a and 24b are always connected in series so as to supply current to the load circuit. If, during the operation of the load circuit at the side of the camera, the brightness should change and the connection of the secondary batteries 24a and 24b is changed, the power source voltage for the load circuit would be changed to half, which could cause a misoperation.

Below, the operation will be explained.

When the shutter button is operated so as to close the switches 160a and 160b with the first stroke, the RS flip-flop circuit 164 is set by means of the output of the differentiating circuit composed of the resistances 161 and 162 and the condenser 163, whereby the output level of the circuit 164 becomes high and that of the inverting circuit 165 becomes low. Thus, the switching transistor 157 is brought into the switched-on state. Further, because the output level of the RS flip-flop circuit 164 is high, the switching transistor 178 in the light measuring and the brightness detection circuit B is in the switched-on state. Thus, the level at the inverting input terminal of the comparison circuit 176 is lowered, while the level of the output of the comparison circuit 176 is always high regardless of the output level of the operational amplifier 172 and that of the inverting circuit 177 is low. Thus, the switching transistors 155 and 158 are brought into the switched-off state. Further, because the output level of the RS flip-flop circuit 164 is high, the output level of the OR gate 159 is also high so as to bring the switching transistor 156 into the switched-off state. Consequently, in this state, the switching transistors 155, 156 and 158 are in the switched-off state and only the transistor 157 is in the switched-on state. Thus, the secondary batteries 24a and 24b are connected in series through the switching transistor 157.

On the other hand, when the output level of the inverting circuit 165 is low, the switching transistor 166 for current supply is in the switched-on state so that power is supplied to the constant voltage circuit 180, the calculation circuit C and the tail shutter curtain control circuit D from the serial-connected secondary batteries 24a and 24b to start the operation. The output of the operational amplifier 172 is applied to the non-inverting amplifier 192, which produces an output whose value is shifted by a value corresponding to that of the resistances 193 and 194. This is necessary because the operational amplifier 172 is driven with 3 V of the power source voltage while the calculation circuit C and the tail shutter curtain control circuit D are driven with 6 V of the power source voltage. This shifted output is delivered to the additional inverting amplifier 198 in the next step so as to be added to the film sensitivity information set on the variable resistance 196, the preset aperture information and the smallest F value information and then inverted so that the additional inverting amplifier produces a voltage corresponding to the APEX value T of the shutter time. This output is inverted and amplified to the inverting amplifier 201 in the next step so as to be stored in the memory condenser 203. At this time, the value of the resistance 200 is chosen equal to that of the resistance 202, while the inverting amplifying ratio of the amplifier 201 is chosen as 1.

When, then, the quick return mirror starts to be raised along with the shutter release, the change-over switch 210 is connected to the side b so that the buffer circuit 211 produces a voltage corresponding to that of the memory condenser 203. When, then, the leading shutter curtain starts to run, the count start switch 214 is opened so that the timing condenser 213 starts to be charged with the collector current corresponding to the logarithmical elongated output voltage of the buffer circuit 211. As soon as the charged amount has reached a certain determined amount, the level at the inverting input terminal of the comparison circuit 217 becomes lower than the level at the non-inverting input terminal so that the output of the comparison circuit 217 is inverted to the high level. This interrupts the current supply to the tail shutter curtain control magnet 218, allowing the start of the tail shutter curtain to complete the exposure.

By means of the inverted output of the comparison circuit 217, the differentiating circuit composed of the resistance 220 and the condenser 219 produces an output, by means of which output the RS flip-flop circuit 164 in the power source circuit A is reset. Accordingly, the output level of the circuit 164 is inverted so as to be low, while the output level of the inverting circuit 165 is inverted to be high. Thus, the power supply switching transistor 166 is brought into the switched-off state so as to interrupt the current supply to the circuits in the next step. Since, at the same time, the output level of the inverting circuit 165 is high, the switching transistor 157 is brought into the switched-off state; further, since the output level of the RS flip-flop circuit 164 is low, the switching transistor 178 in the light measuring and brightness detection circuit B is brought into the switched-off state. Thus, the serial-parallel connection change-over of the secondary batteries 24a and 24b is controlled by means of the output of the operational amplifier 172.

On the other hand, when the shutter button is pushed down to the first stroke and the finger is lifted from the shutter button without releasing the shutter, the switch 160b is opened so as to interrupt the current supply to the RS flip-flop circuit 164, whose output level becomes low. Accordingly, the operation, then, is the same as that where the sequence of the camera operation is completed.

The present embodiment has the following advantage. That is, the brightness level at which the serial-parallel connection change-over of the secondary batteries 24a and 24b is controlled by means of the change of the terminal voltage of the secondary batteries.

Below, the reason why the brightness level at which the serial-parallel connection change-over of the secondary batteries should be controlled by means of the change of the terminal voltage of the secondary batteries will be explained.

Figure 21:
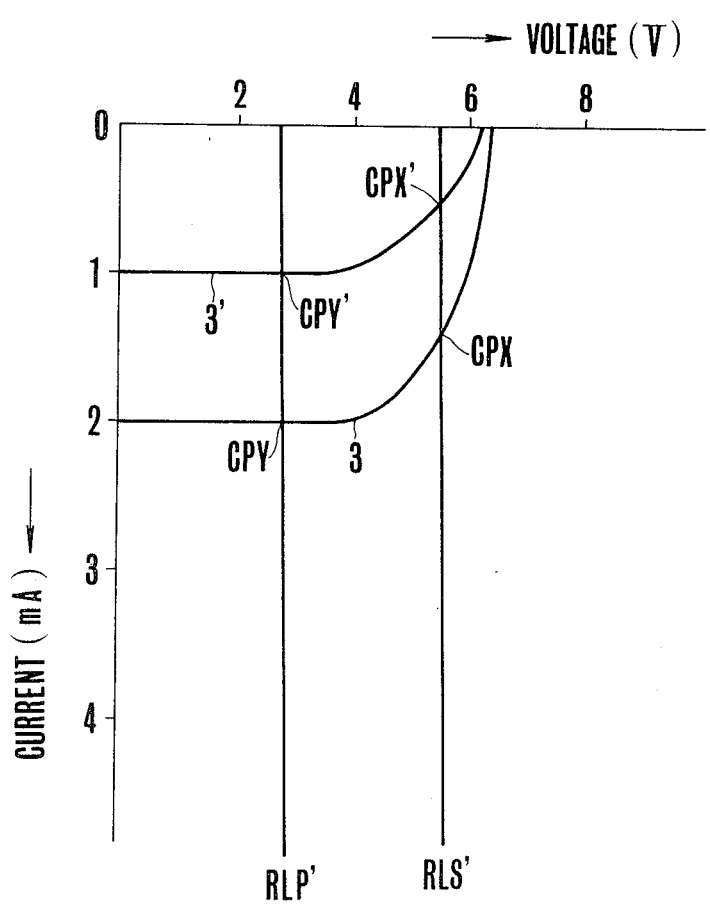
FIG. 21 shows the characteristics of the solar battery shown in FIG. 20.

FIG. 21 shows the load line and the characteristic curve of the solar battery groups when the terminal voltage of the secondary batteries 24a and 24b is lowered.

(3) in the drawing represents the characteristic curve of the 16 serial-connected solar battery groups $21_1-21_{16}$ under X Lux, RLP' the load line when the secondary batteries 24a and 24b are connected in parallel and RLS' the load line when the batteries 24a and 24b are connected in series. The load lines RLP' and RLS', when the terminal voltage of the secondary batteries 24a and 24b is lowered, correspond to the load lines RLP and RLS shown in FIG. 19, translated to the left by the voltage drop. Under X Lux, the charge current when the secondary batteries are connected in parallel is half of the current corresponding to the operation point CPY, while the charge current, when the secondary batteries are connected in series, is equal to that corresponding to the operation point CPX. Thus, as is clear from the drawing, and different from the case shown in FIG. 19, the charge current is smaller when the secondary batteries are connected in parallel. Thus, it is understood that in this case, the brightness at which the serial-parallel connection change-over of the secondary batteries should be controlled, should be set at a value lower than X.

(3)' in FIG. 21 represents the characteristic curve of the solar battery groups $21_1-21_{16}$ under X' Lux. At that time, the operation point when the secondary batteries 24a and 24b are connected in series and that when they are connected in parallel are, respectively, represented by CPX' and CPY'. As is explained above, when the secondary batteries are connected in parallel, the actual charge current for the individual secondary battery is half of the current corresponding to the operation point CPY', so that, as is clear from the drawing, under X' Lux the charge current is the same regardless of the connection of the secondary batteries. The X' Lux makes a boundary, by which for brightness lower than X' Lux, a larger charge current can be obtained when the secondary batteries are connected in parallel, while for the brightness higher than X' Lux, a larger charge current is obtained when they are connected in series. From the comparison with the case shown in FIG. 19, it can be understood that when the terminal voltage of the secondary batteries is lowered due to energy consumption and so on, the brightness at which the serial-parallel connection change-over should be controlled should be made as low as X' Lux. On the other hand, when the terminal voltage of the secondary batteries should be raised due to the overcharging and so on, the brightness at which the serial-parallel connection change-over should be controlled, should be raised.

From the aforementioned explanation, it can be understood that the brightness level at which the serial-parallel connection change-over of the secondary batteries 24a and 24b should be controlled should be altered in accordance with the change of the terminal voltage of the secondary batteries due to the consumption or the charge condition. In the case of the present embodiment, the compensation is automatically carried out by detecting the terminal voltage of the secondary batteries 24a and 24b.

In FIG. 20, the voltage dividing resistances 174 and 175 in the light measuring and brightness detection circuit B are made use of in order to detect the terminal voltage of the secondary battery 24a. That is, when the terminal voltage of the secondary battery 24a is lowered, the level at the inverting input terminal of the comparison circuit 176 is also lowered, so that before the output of the operational amplifier 172 has been raised so high, the output of the comparison circuit 176 is inverted under lower brightness so that the serial-parallel connection change-over of the secondary batteries 24a and 24b is controlled as explained above. On the other hand, when the terminal voltage of the secondary battery 24a is raised, the level at the inverting input terminal of the comparison circuit 176 is also raised and the serial-parallel change-over is controlled under higher brightness. As explained above, in the present embodiment, the brightness level is automatically compensated.

Figure 22:
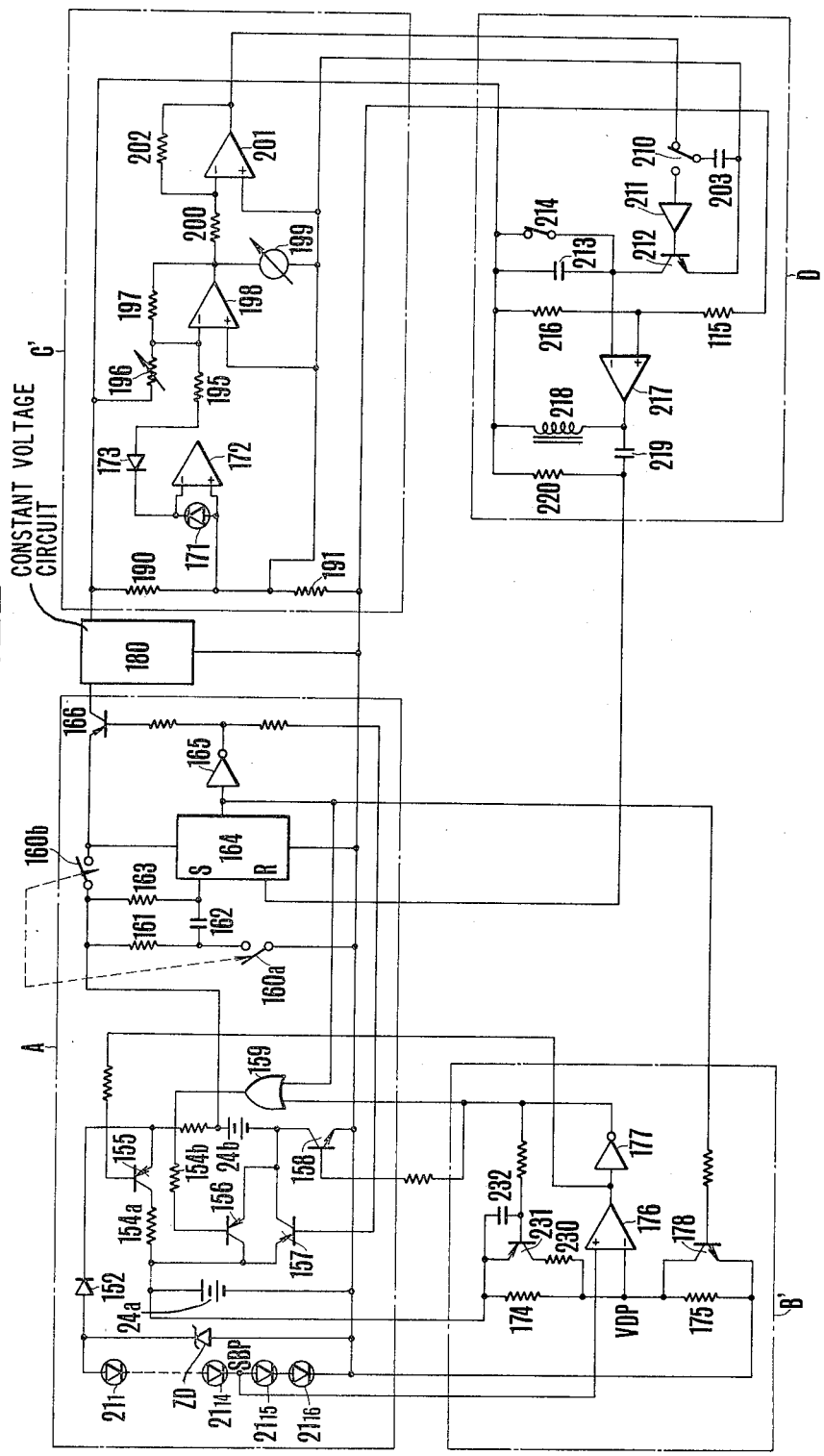
FIG. 22 shows an eleventh embodiment of the electrical circuit in accordance with the present invention of the power source device of the camera in which the solar batteries are used as brightness detectors.

In the present embodiment, only the method in accordance with which the silicon photocell in the light measuring circuit is also used as the element for the brightness detection is mentioned. Below, the method in accordance with which the solar batteries themselves are used as the brightness detection element will be explained as the eleventh embodiment of the present invention in accordance with FIG. 22.

The present embodiment has nearly the same composition as that shown in FIG. 20. The only difference is that silicon photo cell amplifiers 171, 172 and 173 shown in FIG. 20 are moved to the light measuring and calculation circuit C' and that the switching transistor 231 and the resistance are connected in parallel to the voltage dividing resistance 174. Further, the non-inverting input terminal of the comparison circuit 176 is connected to the connecting point SBP of the solar batteries $21_{14}$ and $21_{15}$ in the $21_1$–$21_{16}$, while the inverting input terminal is connected to the connecting point of the voltage dividing resistances 174 and 175. Then, the operation of the present circuit under low brightness will be explained. Because, under low brightness, the potential at the point SBP is low, the level at the non-inverting input terminal of the comparison circuit 156 is lower than that at the inverting input terminal and, therefore, the output level of the comparison circuit 176 is low, while the output level of the inverting circuit 177 is high. Thus, the switching transistors 155 and 158 are brought into the switched-on state, while 156 is brought into the switched-off state. In this state, the secondary batteries 24a and 24b are connected in parallel.

Along with the gradual increase of brightness, the potential at the point SBP is raised until, for a certain brightness, it becomes higher than the level at the inverting input terminal. The output level of the comparison circuit 176 is inverted to be high, and that of the inverting circuit 177 is inverted to be low. In this state, the switching transistors 155 and 158 are in the switched-off state and the switching transistor 156 is in the switched-on state in such a manner that the secondary batteries 24a and 24b are connected in series. Further, the switching transistor 231 is brought into the switched-on state, being delayed by the time corresponding to the time constant of the timing condenser 232. Thus, the potential at the voltage dividing point VDP is largely raised. This is because when the secondary batteries 24a and 24b are connected in series, the potential at the connecting point SBP is largely raised as compared with the case when they are connected in parallel. This is caused by the translation of the operation point CPY into CPX as is shown in FIG. 19. Consequently at this time, the potential at the point VDP, which is the standard level of the comparison circuit 176, is made to be raised at the same time so as to compensate for the raise of the potential at the point SBP in order to detect the brightness at the same level. When, then, the brightness is gradually lowered, the secondary batteries 24a and 24b are connected in parallel in accordance with the reverse sequence. Further at this time, the switching transistor 231 is brought into the switched-off state. As a result, the potential at the voltage dividing point VDP is lowered. This is intended to compensate the large decrease of the potential at the connecting point SBP due to the change-over of the serial connection into the parallel connection.

In the case of the present embodiment, two sets of secondary batteries are connected in series or in parallel. However, it should be understood that more than three sets can also be connected in series or in parallel.

As explained above, in the case of the present embodiment, the solar batteries themselves are made use of as the brightness detecting element so that the following advantage can be obtained compared with the case where a silicon photocell for the light measurement is made use of. That is, a silicon photocell (SPC) for the light measurement is at present provided mostly at the TTL light measuring position so that the condition of the light incident upon the SPC largely differs from that of the light incident upon the solar batteries provided outside of the camera body, which is very inconvenient. In the case of the present embodiment, the brightness is detected by means of the solar batteries themselves so that it can be detected very correctly.

Further, when the solar batteries $21_1$–$21_{16}$ shown in FIGS. 20 and 21 are connected to the comparison and short-circuiting circuits as is shown in FIG. 4, the charge can be carried out by means of the remaining solar batteries by short-circuiting both terminals of one or some solar batteries whose electromotive force is lowered, which is quite effective.

Figure 23:
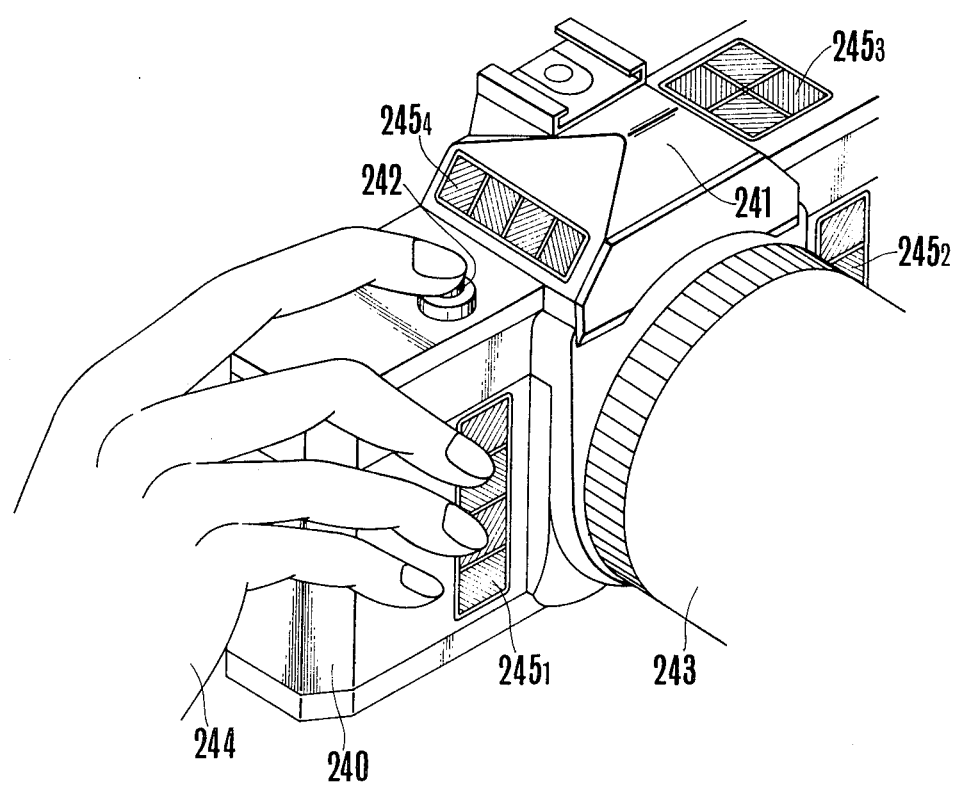
FIG. 23 illustrates a camera for showing an embodiment of the arrangement of the solar battery in each of the embodiments of the electrical circuit in accordance with the present invention.

In the present embodiment, the solar batteries are distributed at various portions of the camera as is shown in FIGS. 23 and 24. In the drawing, 240 is the camera body, 241 is the upper cover and 242 is the shutter button. 243 is the photographing lens while 244 is the hand of the photographer. FIG. 23 shows an embodiment in which the solar battery units $245_1$–$245_4$, each being composed of four solar batteries, are provided at the front plane of the camera 240, the upper cover 241 and at the side of the pentagonal prism of the upper cover 241. FIG. 24 shows an embodiment in which the solar battery units $246_1$–$246_5$, each being composed of three solar batteries, are provided at the front plane of the camera body, the upper cover 241, the front part and the side of the pentagonal prism of the upper cover 241.

As explained above, in accordance with the present invention, by providing each solar battery with the comparison and short-circuiting circuit, the charge can be carried out with the current due to the electromotive force of the remaining solar batteries, short-circuiting both terminals of the solar batteries whose electromotive force is lowered, which is quite effective. Further, the serial-parallel connection change-over of the solar battery groups is automatically carried out in accordance with the ambient brightness in such a manner that the charge current can be obtained quite effectively.

Further, when the solar batteries are distributed over a number of portions of the camera body, a sufficient charge to the secondary battery can be carried by means of the current due to the electromotive force of the solar batteries provided at other portions, although the light incident upon solar batteries provided at some portions is shaded.

While the foregoing description and drawings represent the preferred embodiments of the present invention, it will be obvious to those skilled in the art that various changes and modifications may be made therein without departing from the true spirit and scope of the present invention.

What is claim is:

1. A camera using a solar battery as a power source, comprising:
    a first solar battery group including a plural number of solar batteries connected in series, said plural number of solar batteries being arranged in a dispersed manner on the surface of the camera;
    a second solar battery group including a plural number of solar batteries connected in series, said plural number of solar batteries being arranged in a dispesed manner on the surface of the camera;
    an accumulator to be charged with the photo-current produced with the first and the second solar battery groups;
    non-return means connected between the first and the second means on the one hand, and the accumulator on the other hand, to prevent back current flow from the accumulator;
    light measuring means connected to the accumulator, said means producing a signal corresponding to the brightness;
    signal producing means for producing a signal corresponding to the voltage of the accumulator as a standard signal;
    brightness detection means connected to the accumulator, said means comparing the output signal from the light measuring means with the standard signal from the signal producing means to produce a first signal when the output signal from the light measuring means is higher than the standard signal and a second signal when the output signal from the light measuring means is lower than the standard signal; and
    change-over means for controlling the serial-parallel connection change-over of the first and second solar battery groups, said means connecting the first and the second solar battery groups in parallel when the first signal is applied and in series when the second signal is applied.

2. A power source device in accordance with claim 1, further comprising an exposure control means connected to the accumulator, said means controlling the exposure in accordance with the output of the light measuring means.

3. A power source device in accordance with claim 1, further comprising:
    switching means coupled between both terminals of each solar battery, both terminals of the solar battery not being short-circuited when the switching means is opened, while both terminals are short-circuited when the switching means is closed; and
    comparator means for comparing with each other the levels at both terminals of each of the solar batteries, said means opening the switching means when the difference between the levels at both terminals of the solar battery is higher than a certain determined value and closing the switching means when the difference is lower than the determined value.

4. A camera using a solar battery as a power source, comprising:
    a first solar battery group including a plural number of solar batteries connected in series, said plural number of solar batteries being arranged in a dispersed manner on the surface of the camera;
    a second solar battery group including a plural number of solar batteries connected in series, said plural number of solar batteries being arranged in a dispersed manner on the surface of the camera;
    an accumulator to be charged with the photo-current produced with the first and the second solar battery groups;
    non-return means connected between the first and the second means on the one hand, and the accumulator on the other hand, to prevent the back current flow from the accumulator;
    signal producing means for producing a signal corresponding to the voltage of the accumulator as a standard signal;
    comparator means coupled to the accumulator, said means comparing the signal from a certain determined portion of the first solar battery group with the standard signal from the signal producing means to produce a first signal when the signal from the determined portion is higher than the standard signal and a second signal when the signal from the determined portion is lower than the standard signal;
    change-over means for controlling the serial-parallel connection change-over of the first and the second solar battery groups, said means connecting the first and the second solar battery groups in parallel when the first signal is applied and in series when the second signal is applied;
    switching means coupled to both terminals of each of the solar batteries, both terminals of the solar battery not being short-circuited when the switching means is opened, while both terminals are short-circuited when the switching means is closed; and
    comparator means for comparing the levels at both terminals of each of the solar batteries, said means opening the switching means when the difference between the levels at both terminals of the solar battery is higher than a certain determined value and closing the switching means when the difference between the levels is lower than the determined value.

5. A camera having a solar battery, comprising:
    a plural number of solar battery groups each including a certain number of solar batteries connected to each other and arranged in a dispersed manner on the surface of the camera;

an accumulator to be charged with the photo-current produced with the plural number of solar battery groups;

non-return means connected between the plural number of solar battery groups and the accumulator to prevent back current flow from the accumulator;

a plural number of standard signal producing means connected to the accumulator, each of said means producing a one signal of standard level, signals of standard level produced by the standard signal producing means being different from each other in their signal level in stepwise manner;

a plural number of brightness detection means connected to the accumulator, said means comparing the signal from a certain determined portion of the solar battery groups with the standard signal of the standard signal producing means to produce a first signal when the signal from the determined portion of the solar battery groups is higher than the respective standard signal and a second signal when the signal from the determined portion of the solar battery groups is lower than the respective standard signal, the plural number of brightness detection means inverting the signals different from each other step-wise produced in accordance with the change of the level of the signal from a certain determined portion; and change-over means for controlling the serial-parallel connection combination of the plural number of solar battery groups step by step from the totally serial connection to the totally parallel connection in accordance with the first, the second or the combination of both signals from the plural number of brightness detection means.

6. A camera in accordance with claim 5, further comprising:

switching means coupled between both terminals of each solar battery, both terminals of the solar battery not being short-circuited when the means is opened, while both terminals are short-circuited when the means is closed; and comparator means for comparing with each other the levels at both terminals of each of the solar batteries, said means opening the switching means when the difference between the levels at both terminals of the solar battery is higher than a certain determined value and closing the switching means when the difference is lower than the determined value.

7. A camera having a solar battery, comprising:

a plural number of solar batteries connected in series and arranged in a dispersed manner on the surface of the camera;

a first accumulator to be charged with the photocurrent produced with the plural number of solar batteries;

a second accumulator to be charged with the photocurrent produced with the plural number of solar batteries;

non-return means connected between the plural number of solar batteries on the one hand, and the first and the second accumulator on the other hand, to prevent the back current flow from the first and the second accumulator;

signal producing means for producing a signal corresponding to the voltage of either of the first and second accumulators as a standard signal;

brightness detection means connected to the first and the second accumulator, said means for comparing the signal from a certain determined portion of the plural number of solar batteries with the standard signal from the signal producing means to produce a first signal when the signal from the determined portion of the plural number of solar batteries is higher than the standard signal and a second signal when the output signal from the determined portion is lower than the standard signal;

change-over means for controlling the serial-parallel connection change-over of the first and second accumulator, said means connecting the first and the second accumulator in series when the first signal is applied and in parallel when the second signal is applied.

* * * * *